United States Patent
Watanabe et al.

(10) Patent No.: US 10,230,401 B2
(45) Date of Patent: Mar. 12, 2019

(54) MEMORY CONTROLLER FOR A NON-VOLATILE MEMORY, MEMORY SYSTEM AND METHOD

(71) Applicant: TOSHIBA MEMORY CORPORATION, Minato-ku (JP)

(72) Inventors: Daiki Watanabe, Yokohama (JP); Daisuke Fujiwara, Yokohama (JP); Kosuke Morinaga, Yokohama (JP); Osamu Torii, Setagaya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/456,994

(22) Filed: Mar. 13, 2017

(65) Prior Publication Data
US 2017/0187395 A1    Jun. 29, 2017

Related U.S. Application Data

(63) Continuation-in-part of application No. 14/845,875, filed on Sep. 4, 2015, now abandoned.

(Continued)

(51) Int. Cl.
*H03M 13/29* (2006.01)
*G11C 29/52* (2006.01)
(Continued)

(52) U.S. Cl.
CPC ..... *H03M 13/2909* (2013.01); *G06F 11/1048* (2013.01); *G06F 11/1068* (2013.01);
(Continued)

(58) Field of Classification Search
None
See application file for complete search history.

(56) References Cited

U.S. PATENT DOCUMENTS

| | | |
|---|---|---|
| 6,415,411 B1 | 7/2002 | Nakamura |
| 7,103,824 B2 * | 9/2006 | Halford .......... G06F 11/1076 |
| | | 714/759 |

(Continued)

FOREIGN PATENT DOCUMENTS

| | | |
|---|---|---|
| JP | 2011-081858 A | 4/2011 |
| JP | 2013-197853 A | 9/2013 |
| JP | 2013-546039 A | 12/2013 |

*Primary Examiner* — Justin R Knapp
(74) *Attorney, Agent, or Firm* — Oblon, McClelland, Maier & Neustadt, L.L.P.

(57) ABSTRACT

According to an embodiment, a memory controller for controlling a nonvolatile memory in which multi-dimensional error correction code having two or more component codes is stored, the memory controller configured to read out the multi-dimensional error correction code; acquire a received word of the multi-dimensional error correction code; hold an intermediate decoded word of the multi-dimensional error correction code; perform a first decoding process which is decoding a first component code included in the intermediate decoded word; when a first error symbol included in the first component code is detected by the first decoding process, perform a first rewriting process which is rewriting a value corresponding to the first error symbol in the intermediate decoded word, and record first recurrence information for reproducing a value of the first error symbol before rewriting; perform a second decoding process which is decoding a second component code included in the intermediate decoded word, of which dimension is different from that of the first component code; determine whether the first rewriting process is erroneous correction based on a result of the second decoding process; and when it is determined that the first rewriting process is erroneous correction, perform a counter process which is undoing the first rewriting process based on the recorded first recurrence information.

20 Claims, 26 Drawing Sheets

Related U.S. Application Data

(60) Provisional application No. 62/130,902, filed on Mar. 10, 2015.

(51) Int. Cl.
    *H03M 13/00*     (2006.01)
    *G06F 11/10*     (2006.01)
    *H03M 13/15*     (2006.01)
    *G11C 29/04*     (2006.01)

(52) U.S. Cl.
    CPC ......... *G11C 29/52* (2013.01); *H03M 13/2927* (2013.01); *H03M 13/6502* (2013.01); *G11C 2029/0411* (2013.01); *H03M 13/152* (2013.01); *H03M 13/1515* (2013.01)

(56) References Cited

U.S. PATENT DOCUMENTS

| | | | |
|---|---|---|---|
| 7,120,850 B2 | 10/2006 | Lehobey et al. | |
| 7,137,045 B2 | 11/2006 | Hwang et al. | |
| 8,250,437 B2 | 8/2012 | Sakurada et al. | |
| 8,341,502 B2* | 12/2012 | Steiner | G06F 11/1012 714/755 |
| 9,141,478 B2 | 2/2015 | Katagiri et al. | |
| 9,141,470 B2 | 9/2015 | Yosoku et al. | |
| 9,176,814 B2 | 11/2015 | Cherubini et al. | |
| 2008/0109706 A1 | 5/2008 | Ahn | |
| 2011/0107036 A1* | 5/2011 | Resch | H04L 12/00 711/154 |
| 2014/0289587 A1 | 9/2014 | Nemazie | |

* cited by examiner

MEMORY CONTROLLER FOR A NON-VOLATILE MEMORY, MEMORY SYSTEM AND METHOD

CROSS-REFERENCE TO RELATED APPLICATIONS

This application is a continuation-in-part of U.S. application Ser. No. 14/845,875, filed on Sep. 4, 2015, now allowed, and claims the benefit of priority from U.S. Provisional Application No. 62/130,902, filed on Mar. 10, 2015; the entire contents of which are incorporated herein by reference.

FIELD

Embodiments of described herein generally relate to a memory controller, a memory system and a method.

BACKGROUND

When user data stored in a nonvolatile memory is read from the memory, a phenomenon in which the read user data is changed to a value other than an original value or the like may occur.

In order to cope with this problem, a method of performing error-correction encoding on user data to generate parity data and managing the user data and the parity data as a set is generally used. A Bose Chaudhuri Hocquenghem (BCH) code or Reed-Solomon (RS) code is used as an error correcting code. A product code has been proposed as a method of combining codes to improve correction capability.

DETAILED DESCRIPTION

According to an embodiment, a memory controller that controls a nonvolatile memory in which multi-dimensional error correction code having two or more component codes is stored, the memory controller comprising: a memory interface that reads out the multi-dimensional error correction code; a receiving unit configured to acquire a received word of the multi-dimensional error correction code; an intermediate decoded word memory that holds an intermediate decoded word of the multi-dimensional error correction code; a decoder configured to perform a decoding process and detect information relating to an error symbol; a recurrence information holding unit configured to hold recurrence information for reproducing the information relating to the error symbol detected by the decoding process; and a control unit configured to instruct the decoder to perform a first decoding process of a first component code included in the intermediate decoded word, when a first error symbol included in the first component code is detected by the first decoding process, perform a first rewriting process which is rewriting a value corresponding to the first error symbol in the intermediate decoded word, and record first recurrence information for reproducing a value of the first error symbol before rewriting in the recurrence information holding unit, instruct the decoder to perform a second decoding process of a second component code included in the intermediate decoded word, of which dimension is different from that of the first component code, determine whether the first rewriting process is erroneous correction based on a result of the second decoding process, and when it is determined that the first rewriting process is erroneous correction, perform a counter process which is undoing the first rewriting process based on the first recurrence information recorded in the recurrence information holding unit.

Hereinafter, a memory system, a memory controller and a memory control method according to embodiments will be described in detail with reference to the accompanying drawings. The present invention is not limited to the embodiments.

First Embodiment

Figure 1:
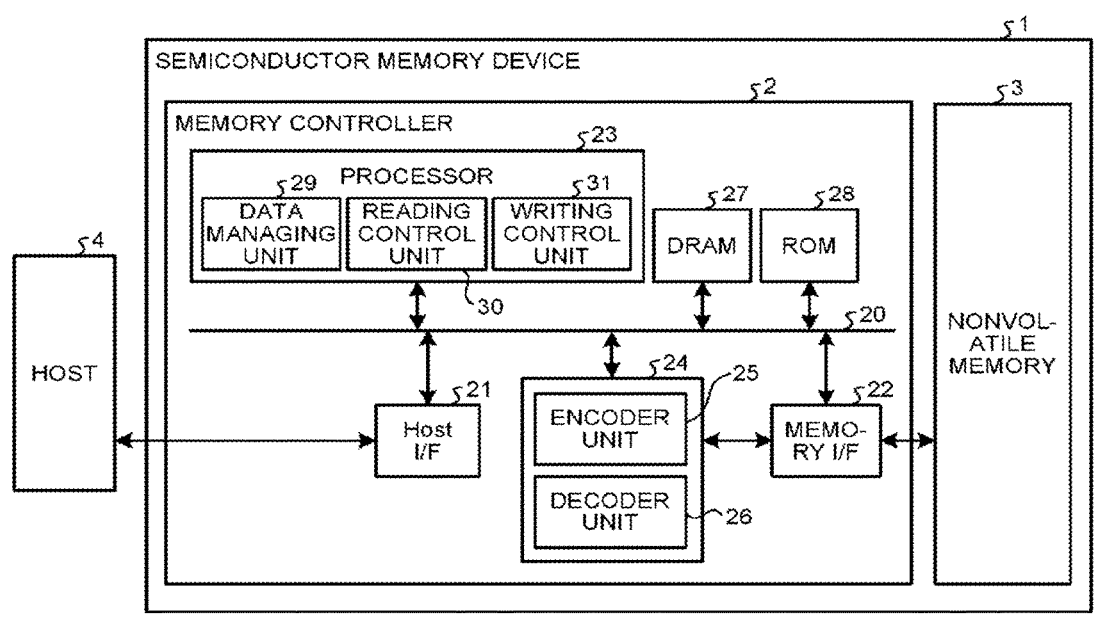
FIG. 1 is a block diagram illustrating a configuration example of a memory system according to a first embodiment.

FIG. 1 is a block diagram illustrating a configuration example of a memory system according to a first embodiment. A semiconductor memory device (storage device) 1 according to this embodiment includes a memory controller 2 and a nonvolatile memory 3. The storage device 1 can be connected to a host 4 and a state in which the storage device is connected to the host 4 is illustrated in FIG. 1. The host 4 is, for example, an electronic device such as a personal computer or a portable terminal. The semiconductor memory device (storage device) 1 according to this embodiment may be a memory card or a solid state drive (SSD) in which the memory controller 2 and the nonvolatile memory 3 are incorporated into a package.

The nonvolatile memory 3 is a memory that stores data in a nonvolatile manner and is, for example, a NAND memory. An example in which a NAND memory is used as the nonvolatile memory 3 is described therein, but a storage unit other than the NAND memory, such as a three-dimensional flash memory, a resistance random access memory (Re-RAM), and a ferroelectric random access memory (Fe-RAM), may be used as the nonvolatile memory 3. In this embodiment, an example in which a nonvolatile memory is used as a storage unit is described, but a nonvolatile memory in which an error correction process of this embodiment is applied to a storage unit other than the nonvolatile memory may be employed.

The memory controller 2 controls writing to the nonvolatile memory 3 in accordance with a writing command (command) from the host 4 and controls reading from the nonvolatile memory 3 in accordance with a reading command (command) from the host 4. The memory controller 2 includes a host I/F 21, a memory I/F 22, a processor 23, an encoder/decoder unit 24, and a dynamic random access memory (DRAM) 27. The encoder/decoder unit 24 includes an encoder unit 25 and a decoder unit 26. The host I/F 21, the memory I/F 22, the processor 23, the encoder unit 25, the decoder unit 26, the DRAM 27, and a read only memory (ROM) 28 are connected to each other via an internal bus 20. The ROM 28 stores firmware to be executed by the processor 23 or the like.

The processor 23 comprehensively controls elements of the semiconductor memory device 1. The function of the processor 23 realizes a data managing unit 29, a reading control unit 30, and a writing control unit 31, for example, by executing the firmware stored in the ROM 28 or the like. Accordingly, the memory controller 2 can perform reading of data from the nonvolatile memory 3 or writing of data to the nonvolatile memory 3 in accordance with a command from the host 4. The data managing unit 29, the reading control unit 30, and the writing control unit 31 may be realized by hardware. The storage destination of the firmware is not limited to the ROM 28, but may be the nonvolatile memory 3.

The data managing unit 29 manages the position in the nonvolatile memory 3 at which data is stored. The data managing unit 29 includes an address conversion table (not illustrated) in which logical addresses given from the host 4 are correlated with physical positions in the nonvolatile memory 3, and perform garbage collection depending on usage of blocks in the nonvolatile memory 3.

The reading control unit 30 performs control of reading data from the nonvolatile memory 3 in accordance with a command transmitted from the host 4 via the host I/F 21. For example, the reading control unit 30 acquires a physical position in the nonvolatile memory 3 corresponding to a logical address of read data from the data managing unit 29 and notifies the memory I/F 22 of the physical position. The read data is transmitted to the host 4 via the decoder unit 26 and the DRAM 27.

The writing control unit 31 performs a process of writing data to the nonvolatile memory 3 in accordance with a command transmitted from the host 4 via the host I/F 21. For example, the writing control unit 31 acquires a physical position in the nonvolatile memory 3 to which data will be written from the data managing unit 29 and outputs the physical position and a code word output from the encoder unit 25 to the memory I/F 22.

The host I/F 21 performs a process based on an interface standard with the host 4 and outputs command received from the host 4, user data, and the like to the internal bus 20. The host I/F 21 transmits user data read from the nonvolatile memory 3, a response from the controller 23, and the like to the host 4.

The memory I/F 22 controls the process of writing data to the nonvolatile memory 3 and the process of reading data from the nonvolatile memory 3 based on an instruction of the controller 23.

The DRAM 27 is used as an area in which user data are temporarily stored when the user data is read or the user data is written. For example, the DRAM 27 is used as a storage unit storing user data on which error correction is not yet performed by the decoder unit 26 and user data on which the error correction is performed when the error correction is performed on the user by the decoder unit 26. In this embodiment, the area in which the user data is temporarily stored is not limited to the DRAM. For example, a static random access memory (SRAM) may be used as the area in which the user data is temporarily stored. The DRAM 27 is installed in the memory controller 2 in this embodiment, but may be installed independently of the memory controller 2. The DRAM may be embodied as a built-in memory in a chip of the memory controller 2.

The controller 23 is a control unit comprehensively controlling the elements of the semiconductor memory device 1. The controller 23 performs control based on a command when the command is received from the host 4 via the host I/F 21.

There is a possibility that an error is included in the data read by the memory I/F 22. This means that there is a possibility that the data read by the memory I/F 22 is not the code word of the original product code that does not include an error. However, in the description below, for simplifying the description, "data that becomes a code word by removing an error" is also referred to as "code word".

For example, when a writing command is received from the host 4, the controller 23 determines a storage area (memory area) in the nonvolatile memory 3 for user data stored in the DRAM 27. The controller 23 manages a writing destination of user data. Correspondence between the logical address of the user data received from the host 4 and the physical address indicating the storage area in the nonvolatile memory 3 in which the user data is stored as an address conversion table. When a writing command is received from the host 4, the controller 23 instructs the encoder unit 25 to encode the user data. When a reading command is received from the host 4, the controller 23 converts a logical address designated by the reading command into a physical address using the address conversion table, and instructs the memory I/F 22 to read the user data from the physical address. When a reading command is received from the host 4, the controller instructs the memory I/F 22 to read a code word from the nonvolatile memory 3 and instructs the decoder unit 26 to perform error correction using the read code word loaded to the DRAM 27.

In a NAND memory, writing units (minimum writing) called a page are generally present, writing and reading are performed by pages, and erasing is performed by data units called a block. When the nonvolatile memory 3 is a NAND memory, the nonvolatile memory 3 includes plural word lines, and plural memory cells (memory cell transistors) are connected to the word lines. In this embodiment, memory cells connected to the same word line are referred to as a memory cell group. When a memory cell is a single-level cell (SLC), one memory cell group corresponds to one page. When a memory cell is a multi-level cell (MLC), one memory cell group corresponds to plural pages. Each memory cell is connected to a word line and a bit line. Each memory cell can be identified by an address for identifying a word line and an address for identifying a bit line.

The encoder unit 25 performs an error correction encoding process based on the user data stored in the DRAM 27 to generate a code word. The encoder unit 25 of this embodiment uses a product code that improves correction capability as a method of combining codes. Error correction codes to be combined are not particularly limited and, for example, a Bose Chaudhuri Hocquenghem (BCH) code or a Reed-Solomon (RS) code can be used. For example, the RS code and the BCH code may be combined, and different types of codes may be combined in this way.

Figure 2:
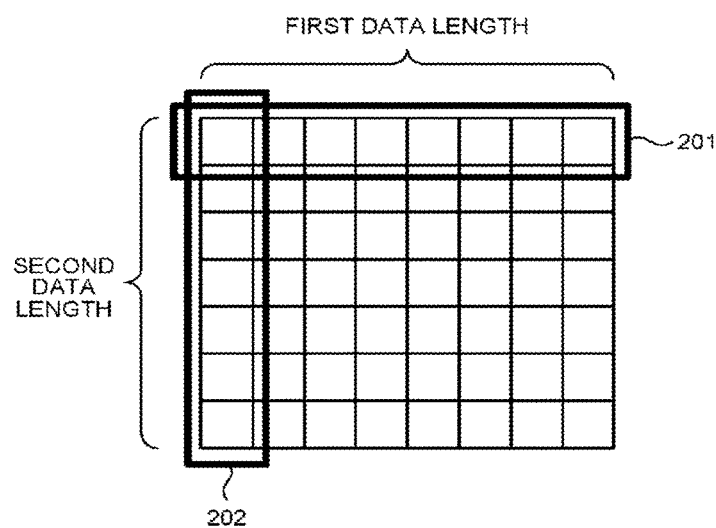
FIG. 2 is a diagram illustrating a configuration example of a product code which is generated by an encoder unit in the first embodiment.

FIG. 2 is a diagram illustrating a configuration example of a product code generated by the encoder unit 25 of this embodiment. The encoder unit 25 generates a code word in the row direction illustrated in FIG. 2 by the number of rows forming the product code. A code word 201 is an example of the code word in the row direction. The encoder unit 25 generates a code word in the column direction by the number of columns forming the product code. A code word 202 is an example of the code word in the column direction. For example, the encoder unit 25 encodes user data of a first data length to generate a component code word in the row direction. The encoder unit encodes user data of a second data length including data of each of plural component code words in the row direction to generate a component code word in the column direction. In the product code, the user data is doubly protected by two code words of the component code word in the column direction and the component code word in the row direction.

In other words, the product code can be called a code word including plural first component code words in the row direction and plural second component code words in the column direction. In this embodiment, the first component code words in the row direction are generated based on a second data row including plurality of pieces of first data (for example, bits) as a unit for correction. In this embodiment, the second component code words in the column direction are generated based on a third data column including plurality of pieces of first data (for example, bits) as a unit for correction, which are respectively selected from plural second data rows. One piece of first data (for example, bit) included in one third data column does not duplicate with another piece of first data (for example, bit) included in another third data column.

The decoder unit 26 performs an error correction process of a product code based on the code words read from the nonvolatile memory 3. The error correction process includes a decoding process and a process of correcting a bit value (inverting the bit value) at an error position calculated through the decoding process. The decoder unit 26 outputs user data on which the error correction process is performed to the internal bus 20. The decoder unit 26 acquires a code word read out of the nonvolatile memory 3 from the memory I/F 22 and decodes the acquired code word. The decoder unit 26 notifies the reading control unit 30 of a reading error when the error correction in the decoding fails.

In this embodiment, when user data is written to the nonvolatile memory 3 in units of a page, the encoding using a product code is performed to generate a code word in units of a page, but the product code may be formed in units of plural pages or plural product codes may be included in one page. In this embodiment, the BCH codes are used as the codes in the row direction and the column direction of a product code, but another code may be used. In this embodiment, a product code is used as an error correction target, but another code may be used as an error correction target.

When a product code is used, an error of user data is corrected by iterating calculation for each component code at the time of decoding. The component code means a row code or a column code in a product code. That is, a component code in the column direction means the entire code words in the column direction (code words in the column direction corresponding to the number of columns forming the product code), and a component code in the row direction means the entire code words in the row direction (code words in the row direction corresponding to the number of rows forming the product code). The component code words mean code words of each component code. The decoder unit 26 performs calculation (error correction process) of each component code word of the component code in the row direction and then performs calculation of each component code word of the component code in the column direction when a non-corrected error remains. The decoder unit 26 performs calculation of each component code word of the component code in the column direction and then performs calculation the component code in the row direction when a non-corrected error remains. By iterating the calculation for each component code in this way, an error of the user data forming the product code is reduced. However, even when the calculation of the component code words succeeds, the code word acquired by the calculation of the component code words may not be a correct code word (the user data written to the nonvolatile memory 3 may not be correctly reconstructed).

Figure 3:
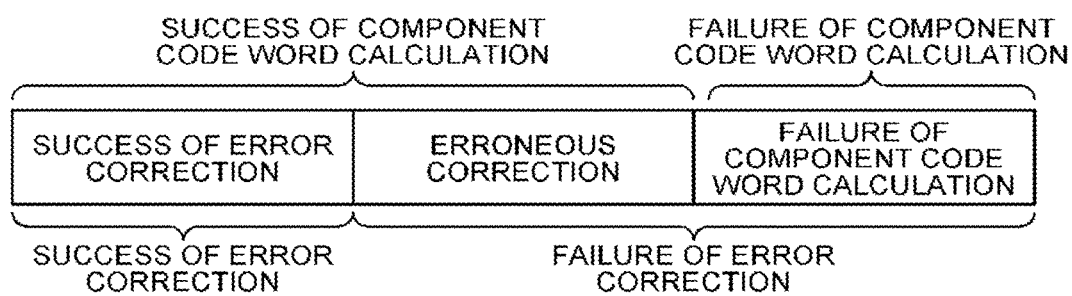
FIG. 3 is a diagram illustrating a pattern formed when error correction is performed on user data in the first embodiment.

FIG. 3 is a diagram illustrating a pattern formed when error correction is performed on user data.

In FIG. 3, a case in which a correct code word is acquired by performing calculation of the component code of an arbitrary column or row is indicated to be "success of component code word calculation". On the other hand, a case in which a component code word is not acquired by performing calculation of the component code in an arbitrary column or row is indicated to be "failure of component code word calculation"

Even when a correct code word is acquired by "success of component code word calculation", the user data may be erroneous. In this embodiment, a case in which the component code word calculation succeeds but the code word acquired as the calculation result is not correct is called "erroneous correction". In case of erroneous correction, since the component code word calculation succeeds but the code word acquired as the calculation result is not correct, the error correction actually fails.

That is, when "success of component code word calculation" is resulted and correct user data is acquired, the error correction succeeds. When the erroneous correction is resulted or the component code word calculation fails, the error correction fails.

The memory controller 2 according to this embodiment performs control of updating user data on which calculation is performed to user data on which the calculation is not yet performed in the case of the erroneous correction or the failure of component code word calculation. In this embodiment, the control of updating the user data on which calculation is performed to the user data on which the calculation is not yet performed is referred to as rollback control.

In a component code word calculation method which is generally used, for example, a component code word calculation method called a bounded distance decoding algorithm, or the like, when the component code word calculation succeeds, it is difficult to determine whether the code word acquired as the calculation result is correct. That is, it is difficult to determine whether erroneous correction occurs.

Therefore, the decoder unit 26 of the memory controller 2 according to this embodiment sets a condition in which there is a possibility that erroneous correction occurs, considers that there is a possibility that erroneous correction occurs when the condition is satisfied, and performs rollback control. The decoder unit 26 performs the rollback control even when the component code word calculation fails.

Figure 4:
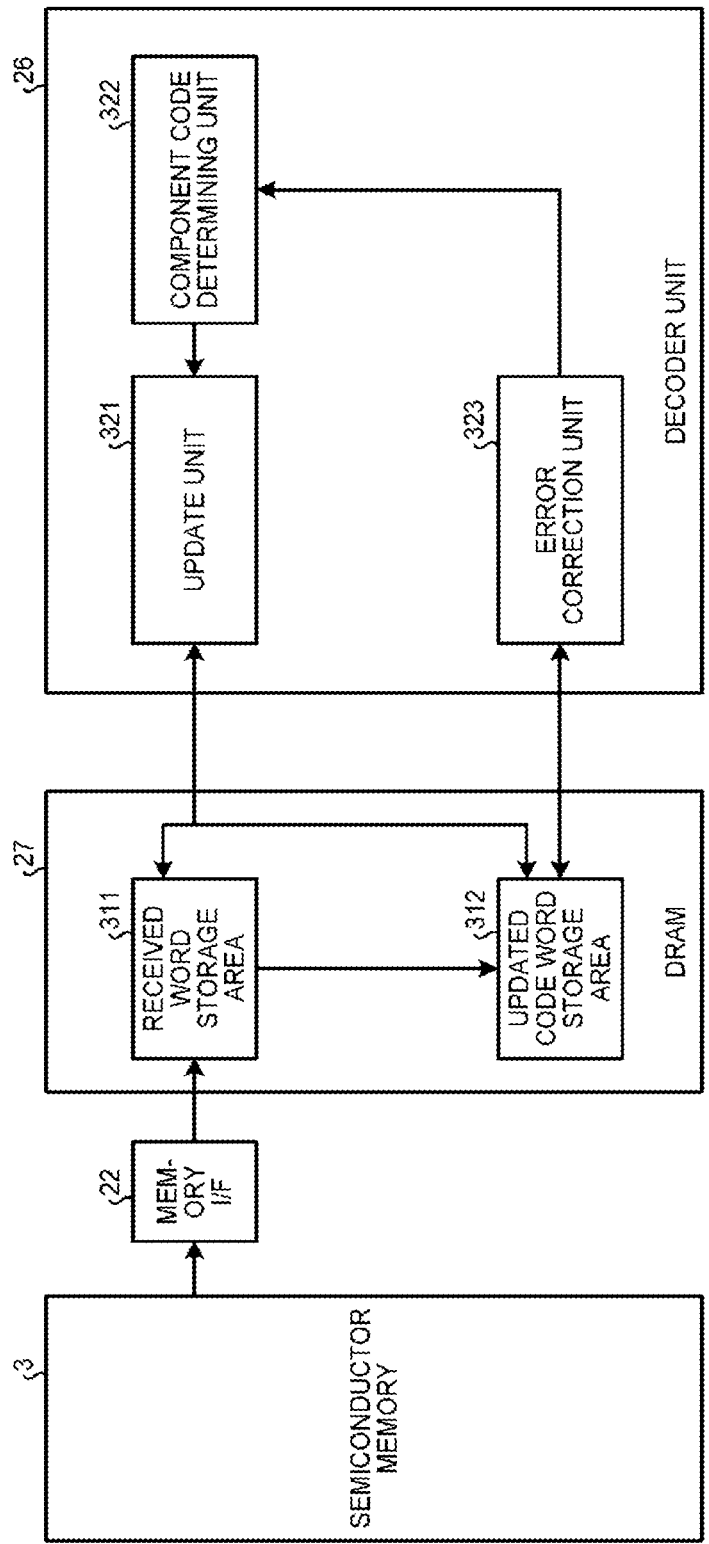
FIG. 4 is a block diagram illustrating a configuration of a decoder unit, a DRAM, and a semiconductor memory in the first embodiment.

A configuration realized in the decoder unit 26 and the DRAM 27 will be described below. FIG. 4 is a block diagram illustrating the configuration in the decoder unit 26 and the DRAM 27. A received word storage area 311 and an updated code word storage area 312 are installed in the DRAM 27. The decoder unit 26 includes an update unit 321, a component code word determining unit 322, and an error correction unit 323. The decoder unit 26 may be realized by a processor and may realize the update unit 321, the component code determining unit 322, and the error correction unit 323 by executing a program (not illustrated). The controller 23 may include the update unit 321, the component code word determining unit 322.

The memory I/F 22 transmits a code word stored in the nonvolatile memory 3 to the DRAM 27 in response to a reading command of user data from the host 4.

The received word storage area 311 is an area in which a received word (code word) received from the nonvolatile memory 3 in response to the reading command via the memory I/F 22 is temporarily stored. In other words, the received word storage area 311 stores a code word (data) on which error correction is not yet performed by the error correction unit 323.

The updated code word storage area 312 is an area in which a code word acquired by performing the component code word calculation on the code word stored in the received word storage area 311 is stored. In this embodiment, when a code word is read to the received word storage area 311, the code word is copied to the updated code word storage area 312. Thereafter, the error correction unit 323 performs error correction using the code word stored in the updated code word storage area 312. In this embodiment, the entire product code is stored in the received word storage area 311 and the updated code word storage area 312 of the DRAM 27, but only partial data instead of the entire product code may be stored.

Based on a product code read from the nonvolatile memory 3 and then stored in the updated code word storage area 312, the error correction unit 323 performs the error correction of code words forming the product code for each component code included in the product code.

The error correction unit 323 of this embodiment performs the error correction in the units of a component code word in the column direction among the product code, performs the error correction on all the component code words in the column direction, performs the error correction in the units of a component code word in the row direction, and performs the error correction on all the component code words in the row direction. The error correction unit 323 of this embodiment alternately iterates the error correction of the plural component code words in the column direction and the error correction of the plural component code words in the row direction.

The component code determining unit 322 determines whether the result of the error correction performed by the error correction unit 323 satisfies a rollback control condition for each component code word on which the error correction is performed.

When the rollback control condition is satisfied, the update unit 321 updates at least some data included in the code word on which the error correction is performed by the error correction unit 323 to data included in the code word on which the error correction is not performed and stored in the received word storage area 311. In other words, the update unit 321 performs rollback control.

Figure 5:
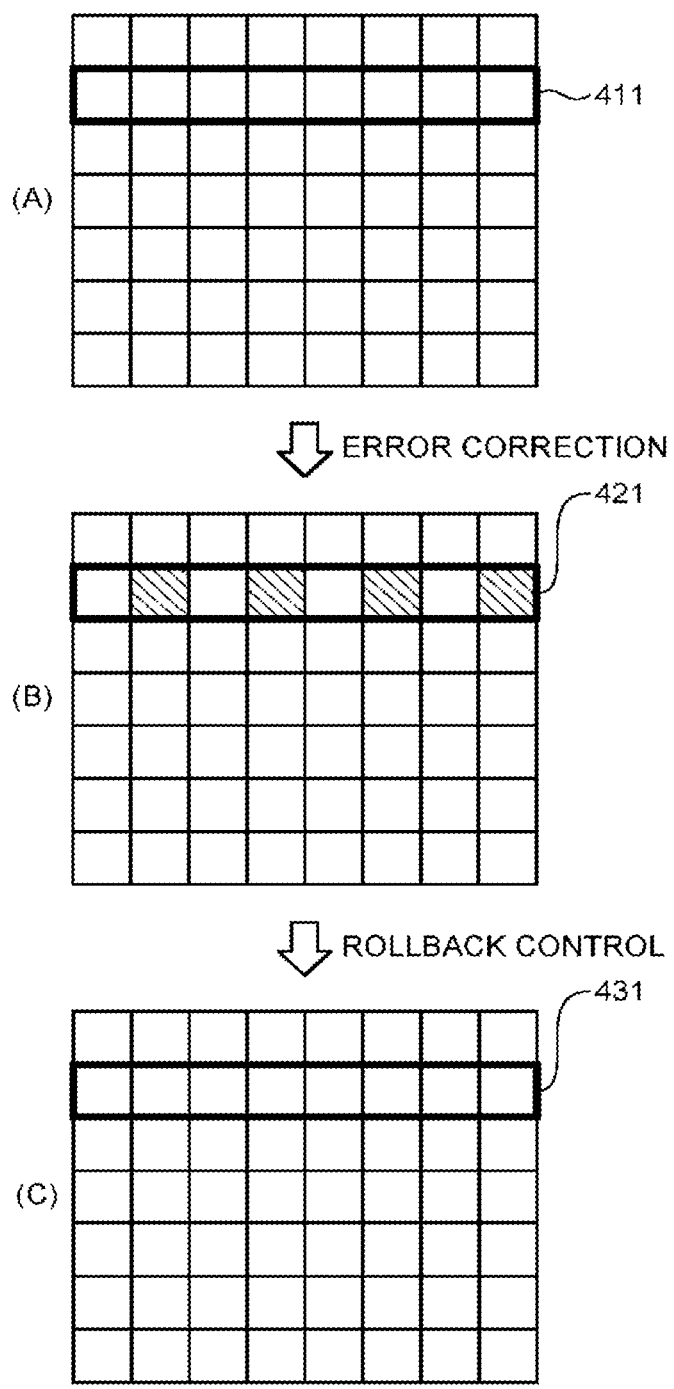
FIG. 5 is a diagram illustrating a state in which rollback control is performed because an inversion number is greater than a reference value when generation of a component code word by error correction succeeds in the first embodiment.
Figure 6:
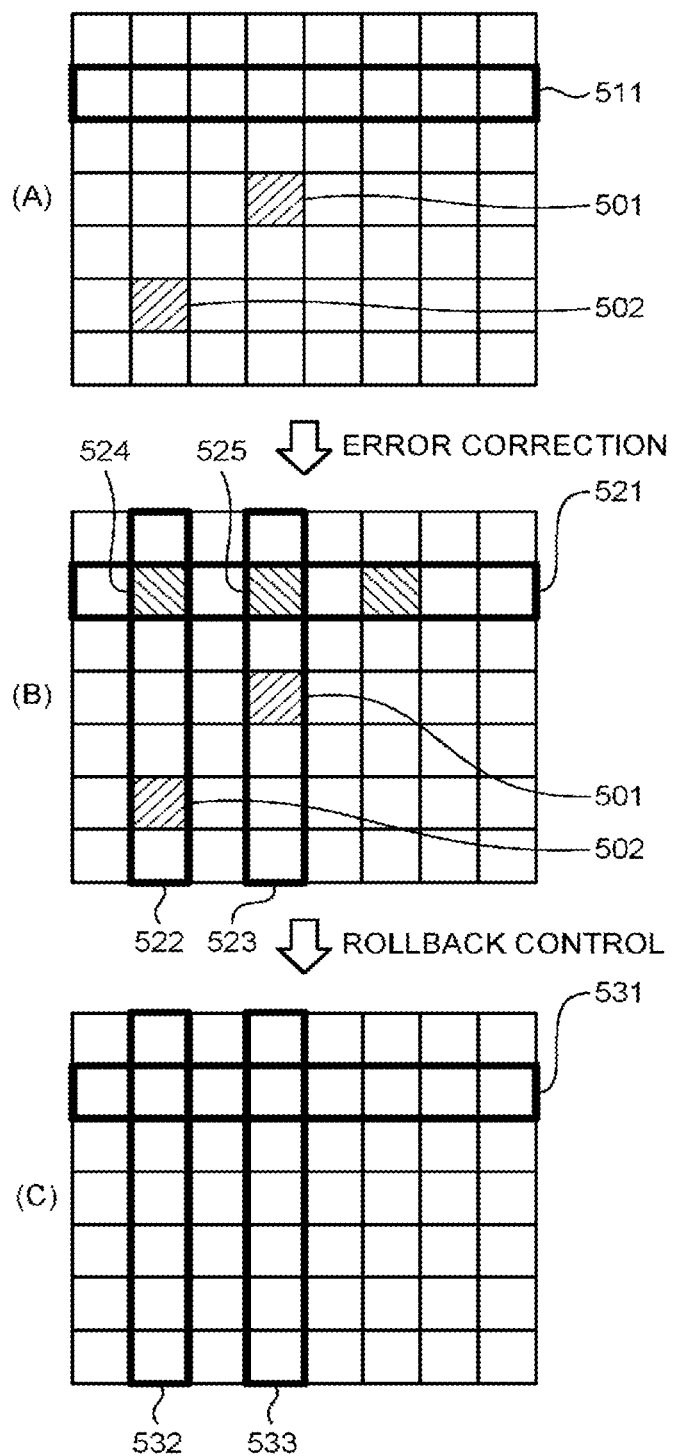
FIG. 6 is a diagram illustrating a state in which rollback control is performed depending on a relation to another component code when generation of a component code word by error correction succeeds in the first embodiment.

A condition (rollback condition) for determining a code word to be rolled back in the rollback control will be described below with reference to FIGS. 5, 6, and 7. FIGS. 5 and 6 illustrate two examples of the rollback condition when the newest error correction of a code word to be subjected to an error correction process succeeds, and FIG.

7 illustrates a rollback condition when the newest error correction of a code word to be subjected to an error correction process fails.

FIG. 5 is a diagram illustrating a state in which the rollback control is performed because an inversion number is equal to or greater than a reference value (threshold value) i when generation of a component code word by the error correction succeeds in the first embodiment. The inversion number means the number of minimum data units (for example, one bit), which can be corrected by the error correction, inverted (corrected) by the error correction. It is assumed that a right-inclined hatched block is data which is inverted by the error correction of a row component code and a left-inclined hatched block is data which is inverted by the error correction of a column component code.

The component code determining unit 322 of this embodiment determines that an erroneous correction probability is high when the inversion number of pieces of data on which error correction is performed by the error correction unit 323 among the component code words is equal to or greater than a predetermined reference value i. In the example illustrated in FIG. 5, the reference value is assumed to be i=4. In this embodiment, it is assumed that the number of pieces of data on which the error correction can be performed using the component code words forming the product code is greater than 4.

The product code acquired by processing a row component code word 411 in (A) of FIG. 5 as an error correction target of the error correction unit 323 is illustrated in (B) of FIG. 5.

In (B) of FIG. 5, it can be seen that four pieces of inverted data are included in a component code word 421 in the row direction on which the error correction is performed, that is, the inversion number is four. Accordingly, the component code determining unit 322 determines that the condition of inversion number≥reference value i is satisfied. Accordingly, the rollback control is performed by the update unit 321. The result of the rollback control is illustrated in (C) of FIG. 5.

In (C) of FIG. 5, it can be seen that the data inverted by the error correction disappears in a row component code word 431 subjected to the rollback control.

In this way, in the example illustrated in FIG. 5, the component code determining unit 322 sets the rollback control condition to whether the inversion number is equal to or greater than the predetermined reference value (threshold value) i. When the condition is satisfied, the update unit 321 updates the data on which the error correction is performed by the error correction unit 323 to the data on which the error correction is not performed and stored in the received word storage area 311.

That is, in the example illustrated in FIG. 5, when the error correction of a component code word succeeds and the inversion number in the component code word on which the error correction is performed is equal to or greater than the reference value i, it is considered that there is a high possibility that the erroneous correction is performed and the rollback control of the component code word is performed. Accordingly, it is possible to suppress progress of the erroneous correction. The reference value i in this embodiment is determined in advance, but may be determined, for example, based on the number of times of error correction iterated by the error correction unit 323.

FIG. 6 is a diagram illustrating a state in which the rollback control is performed based on the calculation result of a code word of a component code in the other direction which is subjected subsequently when generation of a component code word by the error correction succeeds in the first embodiment.

In (A) of FIG. 6, data on which the error correction is performed in column component code words is a plurality of pieces of data 501 and 502. A row component code word 511 is an error correction target of the error correction unit 323. The result of the error correction is illustrated in (B) of FIG. 6.

In (B) of FIG. 6, three pieces of inverted data are included in a component code word 521 in the row direction. Two pieces of the inverted data are a plurality of pieces of data 524 and 525, and the plurality of pieces of data 524 and 525 are included in component code words 522 and 523 in the column direction. However, in the error correction of the component code words 522 and 523 in the column direction, the plurality of pieces of data 501 and 502 are inverted but the plurality of pieces of data 524 and 525 are not inverted. That is, the plurality of pieces of data 524 and 525 which are not inverted when the error correction is performed on the component code words 522 and 523 in the column direction are inverted by the current error correction of the row component code word 521. In this case, it is considered that the erroneous correction is performed by at least one of the error correction of the component code words 522 and 523 in the column direction and the error correction of the component code word 521 in the row direction.

Therefore, in the example illustrated in FIG. 6, the component code determining unit 322 sets the rollback control condition to a case in which at least some data which forms the code words of the component code in one direction of the column direction and the row direction and which are not corrected when the error correction of code words of the component code in one direction is performed is subjected to the error correction at the time of error correction of code words of the component code which include the data in the other direction.

In other words, in this embodiment, the rollback control condition is set to a case in which a bit, on which the error correction is not yet performed, among plural bits (plurality of pieces of first data) included in one component code word of the plural component code words in a first direction (for example, the column direction or the row direction) is corrected by the error correction of another component code word which includes the bit on which the error correction is not yet performed and which is one of the plural component code words in a second direction (the column direction or the row direction which is a direction other than the first direction).

Then, the update unit 321 updates the data on which the error correction is performed by the error correction unit 323 among the data included in the code words of the component code in one direction and the component code in the other direction to the data on which the error correction is not performed and stored in the received word storage area 311.

In this way, the rollback control is performed by the update unit 321. The result of the rollback control is illustrated in (C) of FIG. 6.

In (C) of FIG. 6, it can be seen that the data inverted by the error correction disappears in a component code 531 in the row direction and component codes 532 and 533 in the column direction.

FIG. 6 illustrates an example in which all the row component code 531 and the column component codes 532 and 533 are subjected to the rollback control, but the rollback control may be performed in only one of the row component code and the column component code. That is, the update unit 321 can update at least one of data, which is not corrected by the error correction in the first direction (for example, the column direction or the row direction) but corrected by the error correction in the second direction (the column direction or the row direction which is a direction other than the first direction) and a bit corrected by the error correction in the first direction to the data on which the error correction is not yet performed.

A memory controller 2 according to a modified example that performs rollback control on any one of a row component code and a column component code will be described below. FIG. 7 is a diagram illustrating a state in which the rollback control is performed based on the calculation result of a component code word in the other direction which is subjected subsequently when generation of a component code word by the error correction succeeds in the modified example. In the example illustrated in FIG. 7, the row component code out of the row component code and the column component code is subjected to the rollback control. In (A) and (B) of FIG. 7, the same processes as in (A) and (B) of FIG. 6 are performed.

Figure 7:
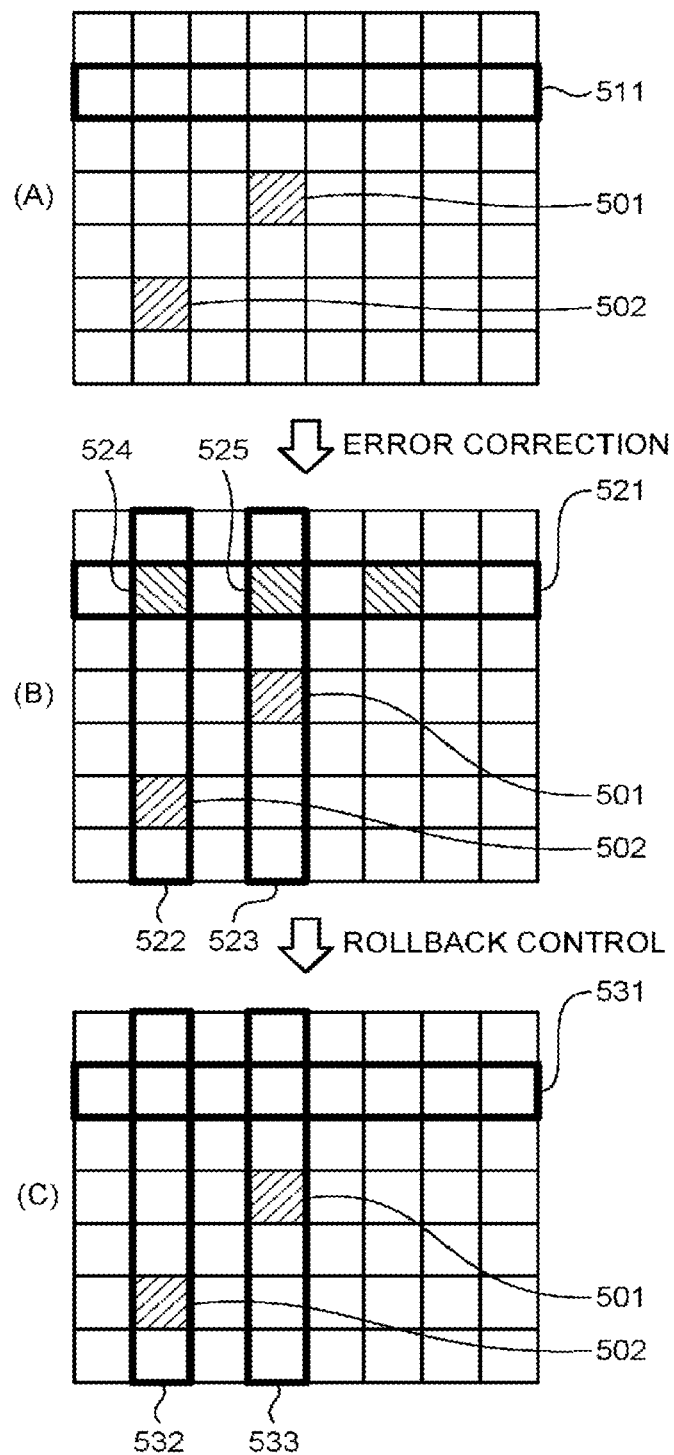
FIG. 7 is a diagram illustrating a state in which rollback control is performed based on a calculation result of a code word of a component code in another direction which is subsequently performed when generation of a component code word by error correction succeeds in a modified example.

In (C) of FIG. 7, the result of the rollback control in the update unit 321 is illustrated. In (C) of FIG. 7, it can be seen that the data which is inverted by the error correction of the component code 531 in the row direction disappears and the data which is inverted by the error correction of the column component codes 532 and 533 (for example, a plurality of pieces of data 501 and 502) is included.

Figure 8:
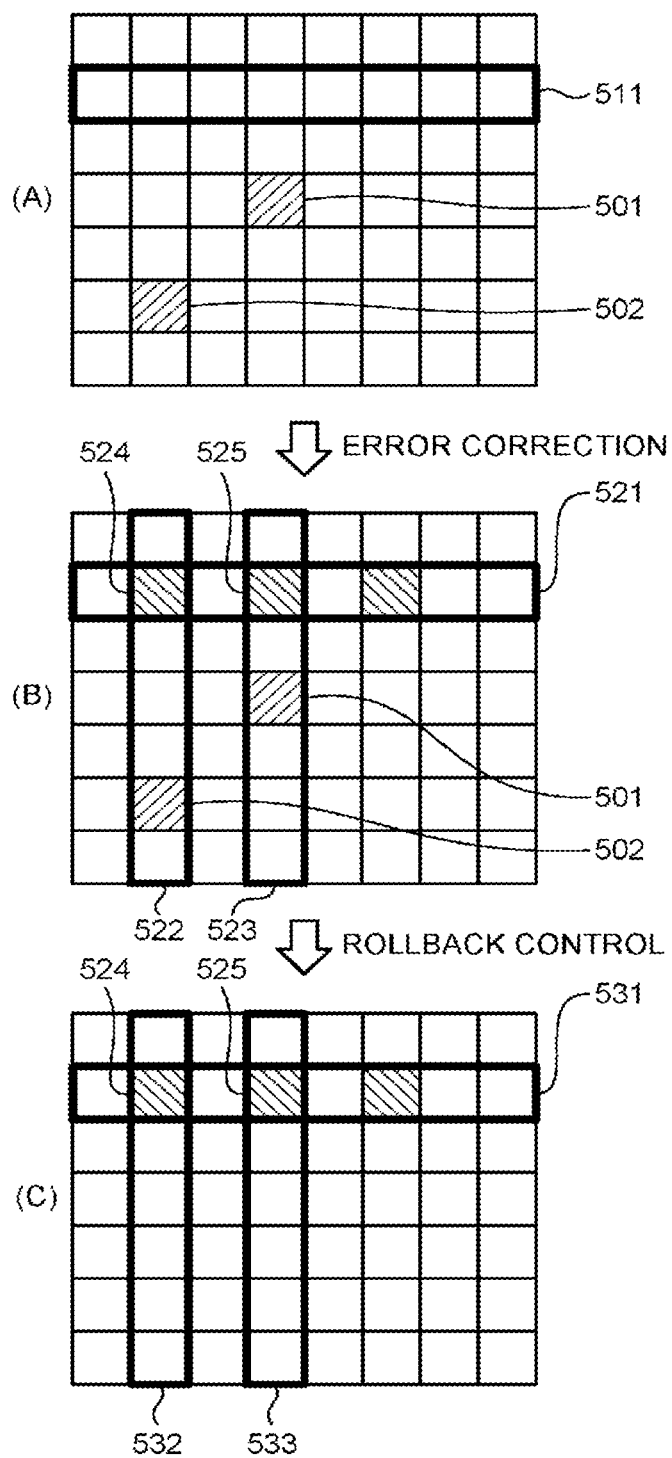
FIG. 8 is a diagram illustrating a state in which rollback control is performed based on a calculation result of a code word of a component code in another direction which is subsequently performed when generation of a component code word by error correction succeeds in a modified example.

FIG. 8 is a diagram illustrating a state in which the rollback control is performed based on the calculation result of a code word of a component code in the other direction which is subjected subsequently when generation of a component code word by the error correction succeeds in the modified example. In the example illustrated in FIG. 8, the column component code out of the row component code and the column component code is subjected to the rollback control. In (A) and (B) of FIG. 8, the same processes as in (A) and (B) of FIG. 6 are performed.

In (C) of FIG. 8, the result of the rollback control by the update unit 321 is illustrated. In (C) of FIG. 8, it can be seen that the data which is inverted by the error correction of the component codes 532 and 533 in the column direction disappears and the data (for example, a plurality of pieces of data 524 and 525) which is inverted by the error correction of the row component code 531 (for example, a plurality of pieces of data 501 and 502) is included.

In this way, even when the rollback control is performed on any one of the row component code and the column component code, the possibility that a data error will be corrected is improved.

Figure 9:
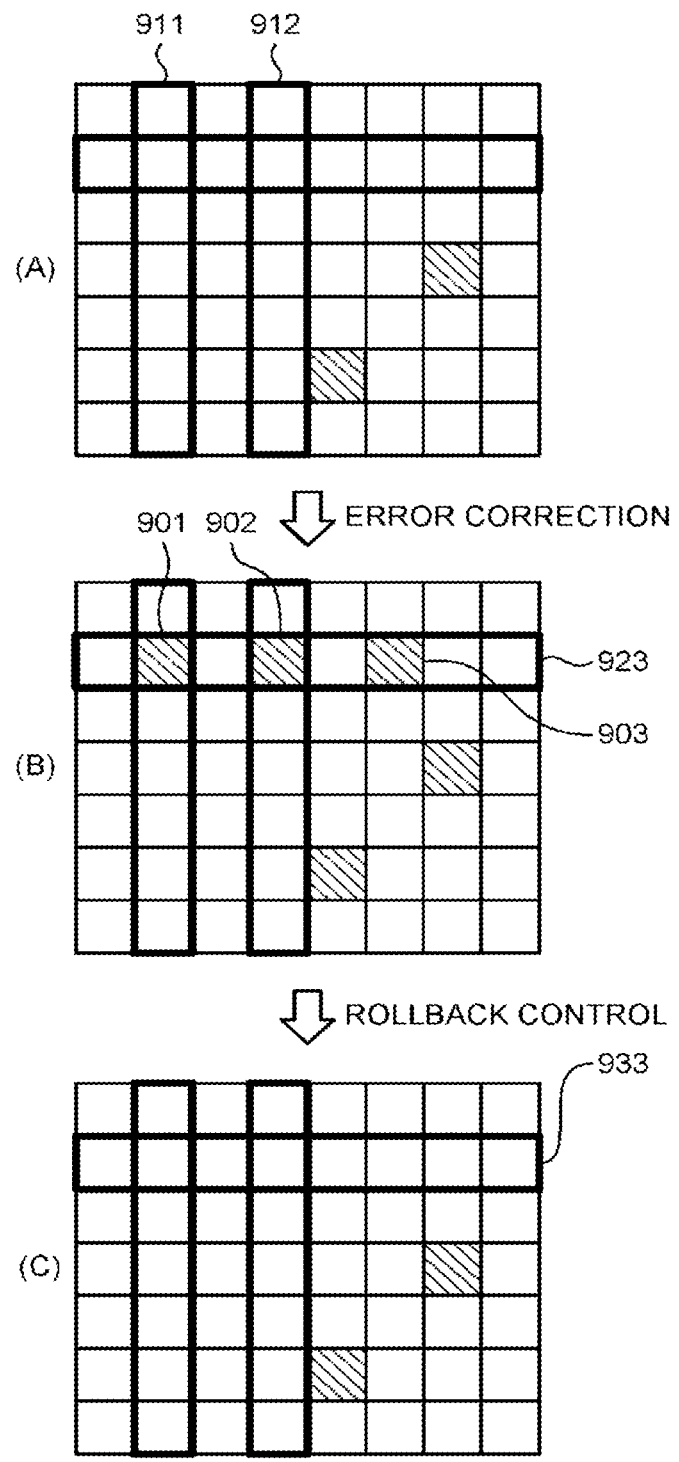
FIG. 9 is a diagram illustrating another state in which rollback control is performed in a memory controller according to a modified example.

Another state can be considered as the state in which the rollback control is performed. FIG. 9 is a diagram illustrating another state in which the rollback control is performed in the memory controller 2 according to the modified example. In (A) of FIG. 9, it is assumed that column component code words 911 and 912 on which the error correction is not yet performed. In the example illustrated in (B) of FIG. 9, a plurality of pieces of data 901, 902, and 903 are inverted by the error correction of a row component code word 923. Since the plurality of pieces of data 901 and 902 are not corrected by the error correction of the column component code words 911 and 912 but are corrected by the error correction of the row component code word 923, the component code determining unit 322 considers that the probability that the error correction of the row component code 923 is erroneous correction is high. The component code determining unit 322 sets the component code 923 as the rollback control target. The update unit 321 generates a row component code word 933 by performing the rollback control on the row component code 923. Accordingly, the possibility that the data error will be corrected is enhanced.

Figure 10:
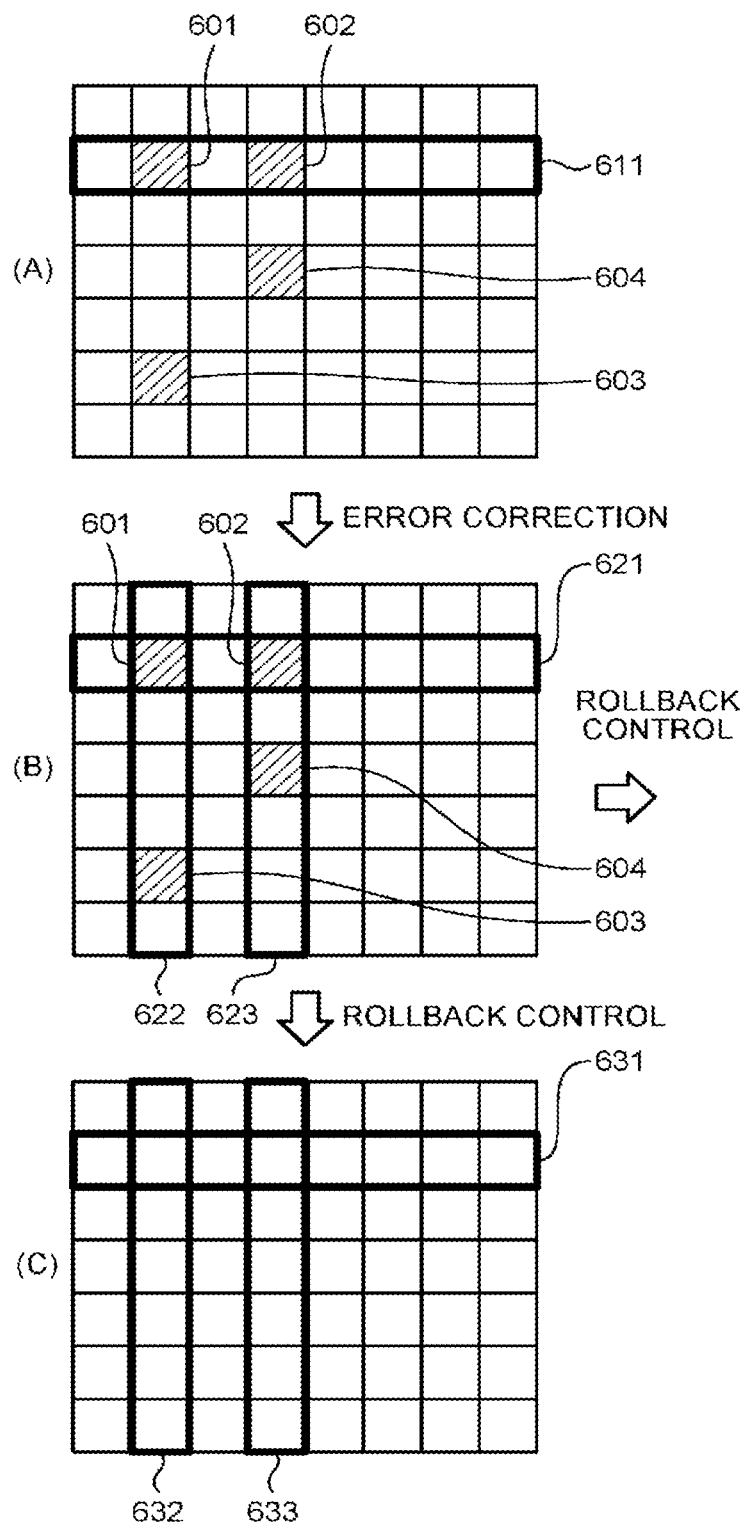
FIG. 10 is a diagram illustrating a case in which generation of a component code word by error correction fails in the first embodiment.

In the first embodiment, a case in which the generation of a component code word by the error correction fails will be described. FIG. 10 is a diagram illustrating a case in which the generation of a component code word in the row direction by the error correction fails.

In (A) of FIG. 10, data which is inverted by the error correction of a component code in the column direction is a plurality of pieces of data 601, 602, 603, and 604. A component code word 611 in the row direction in (A) of FIG. 10 is an error correction target in the error correction unit 323. The result of the error correction of the component code word 611 in the row direction is illustrated in (B) of FIG. 10.

In (B) of FIG. 10, since the error correction of the component code word 611 in the row direction in (A) of FIG. 10 fails, the component code 621 in the row direction subjected to the error correction is not inverted but is maintained in the same state as the component code word 611 due to the failure of error correction. The component code word 621 in the row direction includes the plurality of pieces of data 601 and 602 which are inverted by the error correction of the component code words 622 and 623 in the column direction. Accordingly, it is predicted that there is a possibility that the inversion of the plurality of pieces of data 601 and 602 which has been performed by the error correction of the column component code words 622 and 623 is the erroneous correction and will cause the current error correction of the component code 621 in the row direction. Therefore, the component code determining unit 322 determines the row component code word 621 and the column component code words 622 and 623 to be the rollback control target. Accordingly, the rollback control of the column component code words 622 and 623 is performed by the update unit 321. The result of the rollback control is illustrated in (C) of FIG. 10.

In (C) of FIG. 10, it can be seen that the data which is inverted by the error correction disappears in component code words 632 and 633 in the column direction.

In this way, the component code determining unit 322 sets the rollback control condition to the case in which the error correction is performed on the data included in one component code and then the error correction of another component code having data corrected by the error correction of the one component code fails. When the condition is satisfied, the update unit 321 updates the one component code word to the component code word on which the error correction is not yet performed.

That is, in FIG. 10, the rollback control is performed on the condition that the error correction of another component code word, which includes a bit on which the error correction is performed among plural bits (a plurality of pieces of first data) included in one component code word of plural component code words in the first direction (the row direction or the column direction) and which is one of plural component code words in the second direction (the column direction or the row direction which is a direction other than the first direction), fails. The update unit 321 performs the rollback control on the data corrected by the error correction of the one component code word including the bit on which the error correction is performed.

In this embodiment, the flow of returning the state on which error correction is performed to the state on which the error correction is not yet performed through the rollback control of a component code which is considered the component code on which the error correction is performed by the decoder unit 26 is described. When the error correction is performed on the component code subjected to the rollback control after the error correction of another component code is performed after the rollback control, the condition is different from the condition before the rollback control and thus the possibility that appropriate error correction will be performed is enhanced.

Figure 11:
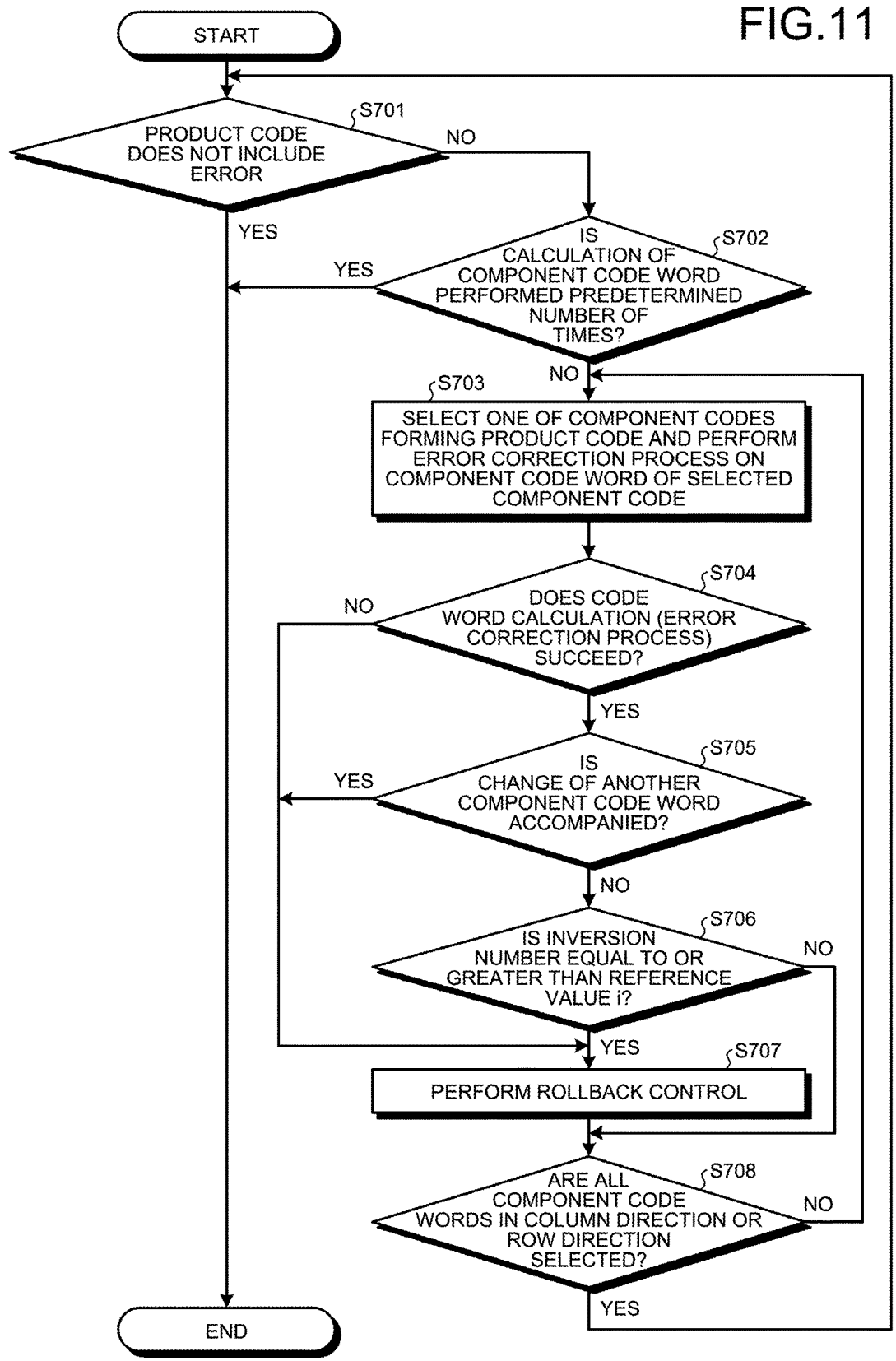
FIG. 11 is a flowchart illustrating a process flow up to rollback control in a memory controller according to the first embodiment.

The process flow up to the rollback control in the memory controller 2 according to this embodiment will be described below. FIG. 11 is a flowchart illustrating the process flow in the memory controller 2 according to this embodiment. Before the process flow illustrated in FIG. 11, it is assumed that a product code stored in the nonvolatile memory 3 is loaded to the received word storage area 311 in response to a command from the host 4 and the product code is copied to the updated code word storage area 312.

First, the error correction unit 323 of the decoder unit 26 determines whether the product code stored in the updated code word storage area 312 does not include an error (S701). In S701 of the first time, for example, the entire component code words in the row direction are decoded and it is determined whether the product code does not include an error based on information on error presence or absence acquired by the decoding. When the error correction unit 323 determines that the product code does not include an error (YES in S701), the process flow ends.

On the other hand, when the error correction unit 323 determines that the product code includes an error (NO in S701), the error correction unit 323 determines whether calculation of component codes (error correction process) in the column direction and the row direction is performed on the product code a predetermined number of times (S702). The predetermined number of times may be determined for the number of times of component code calculation with both component code calculations in the column direction and the row direction as a set or may be determined for the total number of times of component code calculation. It is assumed that the predetermined number of times is determined depending on the performance of the nonvolatile memory 3 or the embodiment, and thus description thereof will not be repeated. When it is determined that the component code word calculation is performed the predetermined number of times (YES in S702), the process flow ends.

On the other hand, when the error correction unit 323 determines that the component code word calculation on the product code is not performed the predetermined number of times (NO in S702), one (the row direction or the column direction) of the component codes forming the product code is selected and the error correction process (code word calculation) on component code words of the selected component code is performed (S703). In the selecting of the component code in S703, for example, when the row direction is first selected, the row direction is selected until the calculation is performed on all the component code words including an error among the component code words in the row direction, and the column direction is selected after the calculation is performed on all the component code words including an error among the component code words in the row direction. The column direction is selected until the calculation is performed on all the component code words including an error among the component code words in the column direction, and the row direction is selected after the calculation is performed on all the component code words including an error among the component code words in the column direction. In this way, the column direction and the row direction are selected so as to alternately perform the calculations in the column direction and the row direction.

Then, the component code determining unit 322 determines whether the code word calculation (error correction process) succeeds (S704). When it is determined that the component code word calculation fails (NO in S704), the process flow moves to S707.

On the other hand, when it is determined that the code word calculation succeeds (YES in S704), the component code determining unit 322 determines whether the error correction calculation accompanies a change of another component code word having common data (S705). For example, as illustrated in FIG. 6, when the data on which error correction is performed (of which a bit value is inverted) by the code word calculation performed in S703 is data on which error correction is performed by the code word calculation of another component code word, it is determined that a change of another component code word is accompanied. When it is determined that a change of another component code word is accompanied (YES in S705), the process flow moves to S707. The specific control of S705 is the same as described with reference to FIG. 6 and description thereof will not be repeated.

On the other hand, when it is determined that the error correction calculation does not accompany a change of another component code word having common data (NO in S705), the component code determining unit 322 determines whether the inversion number in the component code word is equal to or greater than the reference value i (S706). When it is determined that the inversion number is not equal to or greater than the reference value i (NO in S706), the process flow moves to S708.

On the other hand, when the component code determining unit 322 determines that the inversion number in the component code word is equal to or greater than the reference value i (YES in S706), the process flow moves to S707.

The update unit 721 performs the rollback control on component code to be currently calculated using the code word on which the error correction is not yet performed and stored in the received word storage area 311 (S707). The rollback control is also performed on another component code in which the component code to be currently calculated is changed when the calculation in S703 fails, or the rollback control is performed on another component code when a change of another component code word is accompanied in S705.

The error correction unit 323 determines whether all the component code words in the column direction or the row direction are selected (S709). When it is determined that all the component code words in the column direction or the row direction are not selected (NO in S709), the process flow from S703 is performed. On the other hand, i=4 when it is determined that all the component code words in the column direction or the row direction are selected (YES in S709), the process flow from S701 is performed.

According to this process flow, when the erroneous correction is performed or when the calculation for the error correction fails, the rollback control is performed and it is thus possible to enhance the probability that correct user data can be acquired. In this embodiment, the rollback control is performed in the case in which it is determined that the component code word calculation fails, in the case in which it is determined that a change of another component code word is accompanied, and in the case in which it is determined that the inversion number in the component code word is equal to or greater than the reference value i. However, the rollback control is not limited to all the three conditions of the case in which it is determined that the component code word calculation fails, the case in which it is determined that a change of another component code word is accompanied, and the case in which it is determined that the inversion number in the component code word is equal to or greater than the reference value i, but the rollback control may be performed in one or two conditions of the three conditions. In addition, one or more conditions of the three conditions may be combined with another condition.

Second Embodiment

In the first embodiment, the example in which the same rollback control is always performed regardless of the progress of the iterated correction of the product code when there is a possibility that the erroneous correction will occur or when the generation of a code word fails has been described. However, when a component code word of which the erroneous correction is not sure is subjected to the rollback control, the erroneous correction probability is lowered. However, by performing the rollback control on the component code word in which the erroneous correction does not occur, there is a possibility that a delay will occur due to the iterated correction of the product code.

Therefore, in a second embodiment, the rollback control is changed depending on the progress of the iterated correction of a product code.

Figure 12:
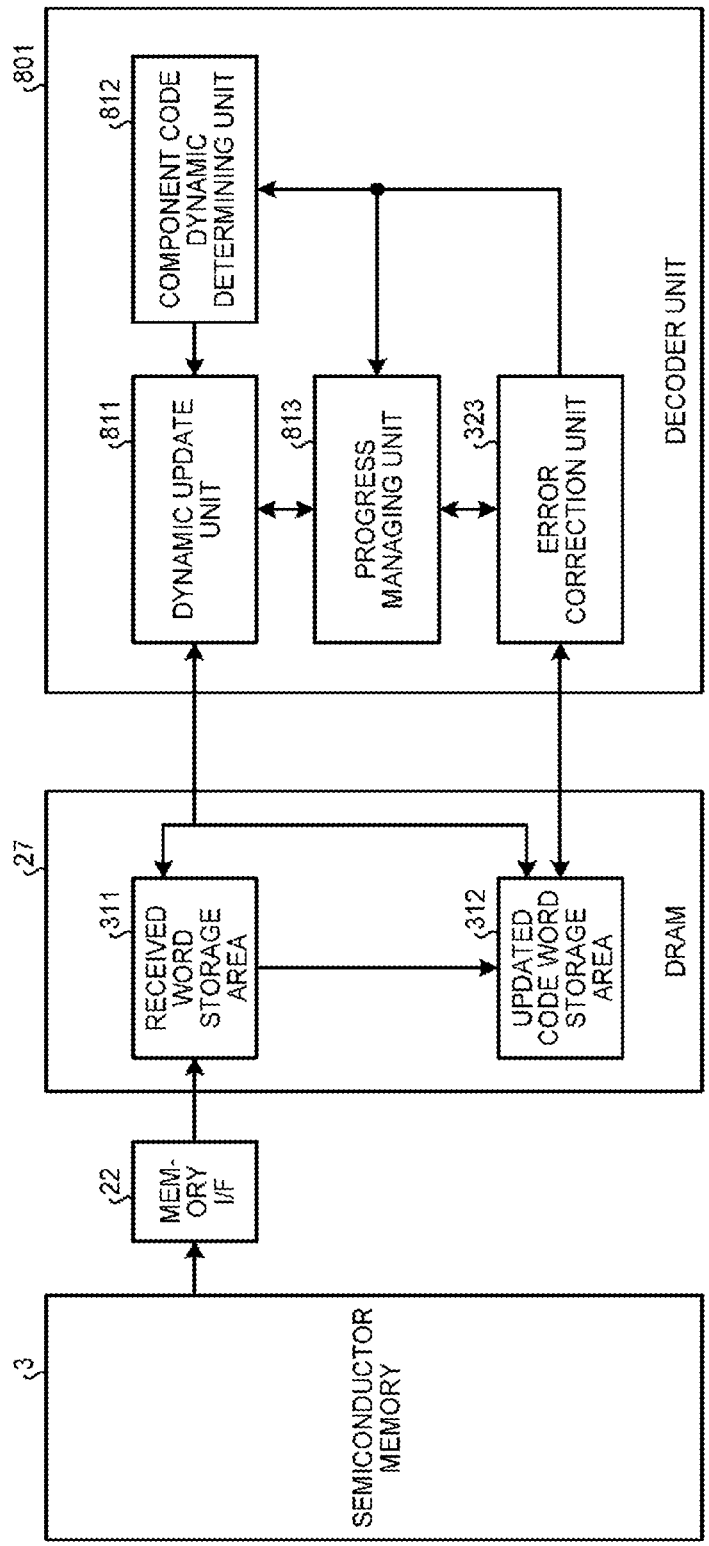
FIG. 12 is a block diagram illustrating a configuration of a controller, a DRAM, and a semiconductor memory according to a second embodiment.

FIG. 12 is a block diagram illustrating a configuration of a decoder unit 801, a DRAM 27, and a nonvolatile memory 3 in the second embodiment. In FIG. 12, a received word storage area 311 and an updated code word storage area 312 are installed in the DRAM 27, similarly to the first embodiment.

The decoder unit 801 includes a dynamic update unit 811, a component code dynamic determining unit 812, a progress managing unit 813, and an error correction unit 323. The decoder unit 801 may be mounted as a processor and may realize the dynamic update unit 811, the component code dynamic determining unit 812, the progress managing unit 813, and the error correction unit 323 by executing a program (not illustrated). The controller 23 may include the dynamic update unit 811, the component code dynamic determining unit 812, the progress managing unit 813, and the error correction unit 323. In the second embodiment, the same elements as in the first embodiment will be referenced by the same reference numerals and description thereof will not be repeated.

The progress managing unit 813 manages the progress of the iterated correction of error correction on a product code by the error correction unit 323. The progress managing unit 813 in this embodiment stores the number of times of iterated error correction of a component code as the progress of the iterated correction.

The component code dynamic determining unit 812 determines whether the result of the error correction performed by the error correction unit 323 satisfies the rollback control condition for each component code word on which the error correction is performed in consideration of the progress.

For example, the reference value i is determined in advance in the first embodiment, but the reference value i varies depending on the progress in the second embodiment.

In this embodiment, the error correction unit 323 alternately iterates the error correction of the plural component code words in the column direction and the error correction of the plural component code words in the row direction. The reference value i is set depending on the number of times of iterated error correction.

In this embodiment, when the number of times of iterated error correction of a component code is less than Threshold value A, the component code dynamic determining unit 812 sets the reference value to i=2. When the number of times of iterated error correction of a component code is equal to or greater than Threshold value A and less than Threshold value B, the component code dynamic determining unit 812 sets the reference value to i=3. When the number of times of iterated error correction of a component code is equal to or greater than Threshold value B, the component code dynamic determining unit 812 sets the reference value to i=4.

Figure 13:
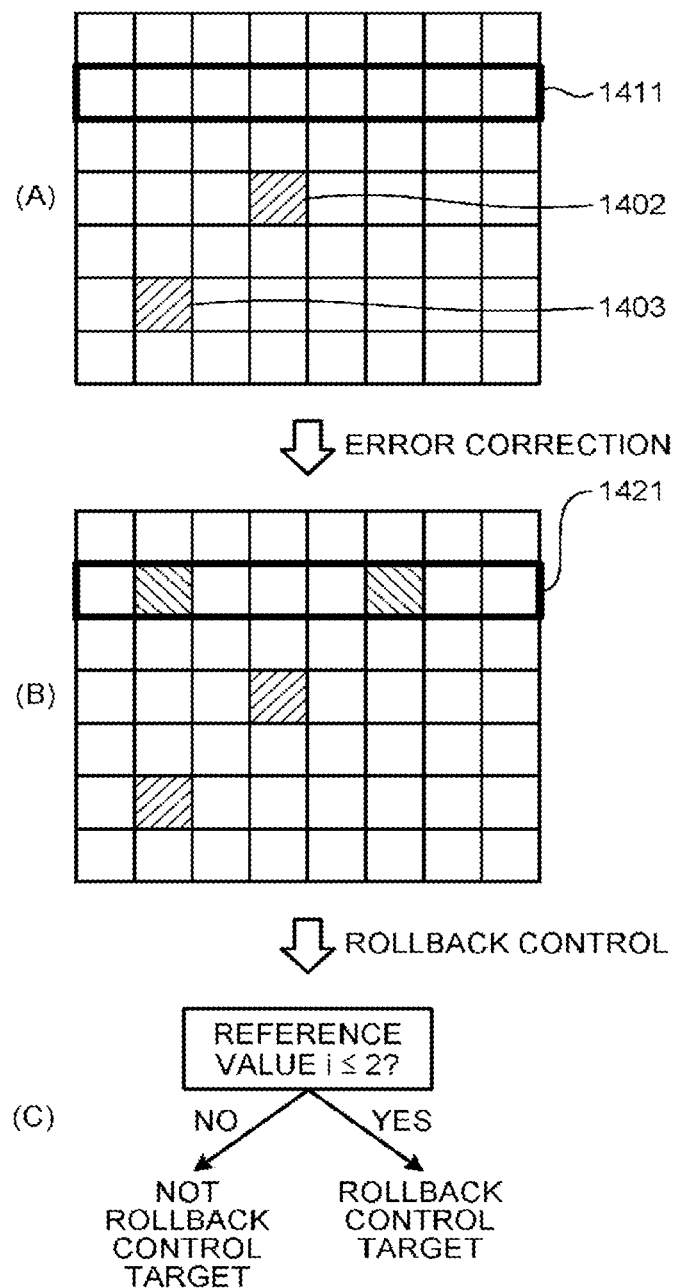
FIG. 13 is a diagram illustrating a flow of determining a rollback control target in a component code dynamic determining unit in the second embodiment.

FIG. 13 is a diagram illustrating determination of a rollback control target in the component code dynamic determining unit 812 of this embodiment.

In (A) of FIG. 13, data inverted by the error correction of component code words in the column direction are a plurality of pieces of data 1401 and 1402. A row component code word 1411 in (A) of FIG. 13 is set as an error correction target of the error correction unit 323. A product code as the process result of the error correction target is illustrated in (B) of FIG. 13.

In (B) of FIG. 13, it can be seen that two pieces of inverted data are included in a component code word 1421 in the row direction subjected to the error correction, that is, the inversion number is i=2. The component code dynamic determining unit 812 determines whether the condition of inversion number≥reference value i is satisfied. The reference value i is determined depending on the number of times of iterated error correction of a component code as described above.

As illustrated in (C) of FIG. 13, the control of the component code dynamic determining unit 812 varies depending on whether the condition of reference value i≤2 is satisfied. That is, when the condition of reference value i≤2 is satisfied, the component code word 1421 is determined to be a rollback control target. On the other hand, when the condition of reference value i>2 is satisfied, the component code word 1421 is determined not to be a rollback control target.

In this way, in the component code dynamic determining unit 812 and the dynamic update unit 811 of this embodiment, the reference value i varies depending on the number of times of iterated error correction which is performed by the error correction unit 323. In this way, the dynamic update unit 811 determines the reference value (threshold value) i based on the number of times of iterated error correction in the error correction unit 323.

That is, when the iterated correction of error correction is performed, it is thought that the error correction has to be surely performed at the first time. Accordingly, the dynamic update unit 811 of this embodiment performs control of setting the first reference value i to be small, carefully performing the error correction, and slowly increasing the reference value i, whereby the error correction capability of a product code can be satisfactorily used.

The component code dynamic determining unit 812 determines the rollback control target based on only the inversion number, but the rollback control (example illustrated in FIG. 6) based on the calculation result of component code words in the other direction which is subsequently performed may vary depending on the progress. Even when the generation of a component code word by the error correction fails, the rollback control target varies depending on the progress.

In this way, in the component code dynamic determining unit 812 and the dynamic update unit 811 of this embodiment, the target to be updated to data on which the error correction is not yet performed varies depending on the number of times of iterated error correction which is performed by the error correction unit 323.

That is, the dynamic update unit 811 performs the rollback control on at least one of data which is not corrected by the error correction in the first direction (for example, the column direction or the row direction) but is corrected by the error correction in the second direction (the column direction or the row direction which is a direction other than the first direction) and data which is corrected by the error correction in the first direction based on the number of times of iterated error correction. The dynamic update unit 811 determines data to be subjected to the rollback control based on the number of times of iterated error correction which is performed by the error correction unit 323. For example, it is thought that both data is set as the rollback control target when the number of times of iteration is small, and any one data is set as the rollback control target when the number of times of iteration is large.

The dynamic update unit 811 updates at least some data forming a component code word on which the error correction is performed by the error correction unit 323 to data on which the error correction is not yet performed and stored in the received word storage area 311. The dynamic update unit 811 of this embodiment performs different rollback control depending on the progress.

In this embodiment, partial rollback control and entire rollback control are performed as the rollback control.

The partial rollback control is control of returning only data common to one component code word to be subjected to the rollback control and another component code word to be subjected to the rollback control to the state on which the error correction is not yet performed.

The entire rollback control is control of returning all data included in one component code word to be subjected to the rollback control and another component code word to be subjected to the rollback control to the state on which the error correction is not yet performed. The rollback control of the first embodiment corresponds to the entire rollback control.

The dynamic update unit 811 performs one of the partial rollback control and the entire rollback control depending on the progress.

Figure 14:
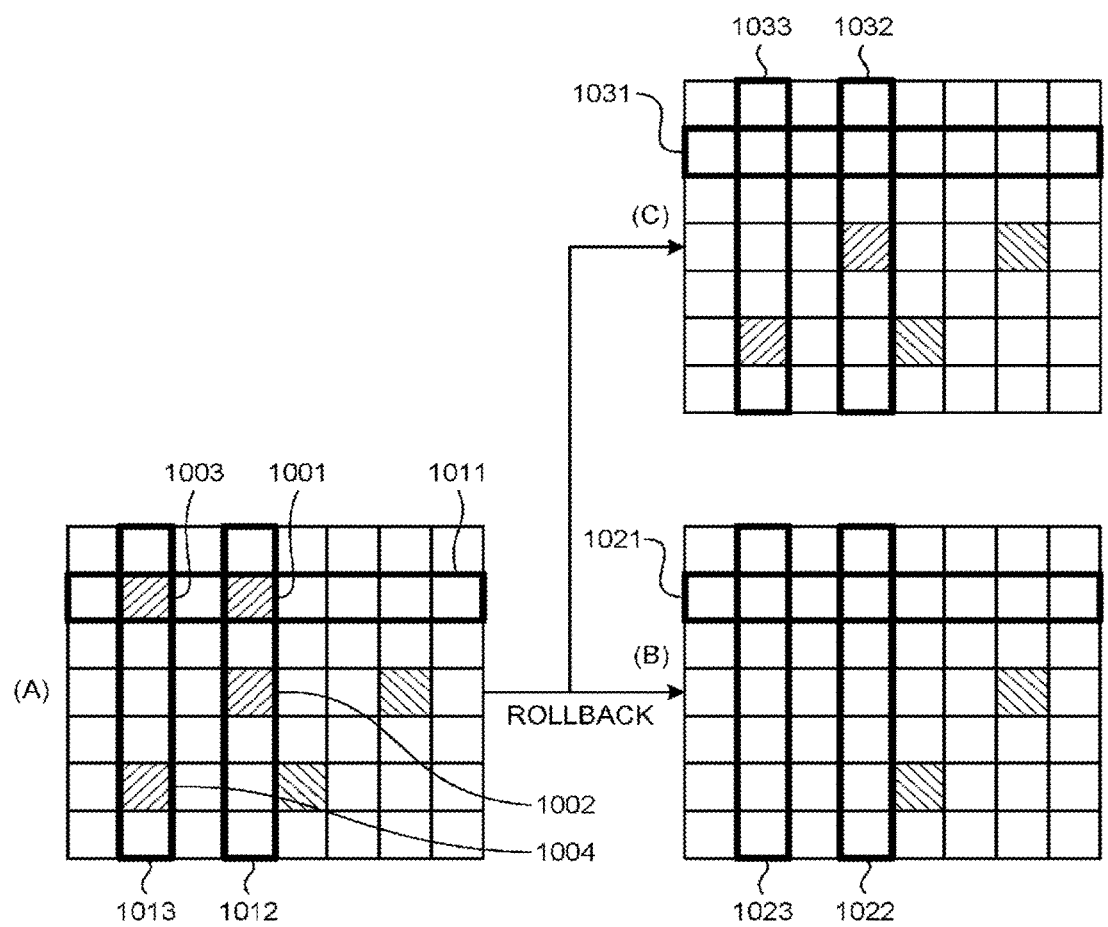
FIG. 14 is a diagram illustrating rollback control in a dynamic update unit when generation of a code word by error correction fails in the second embodiment.

FIG. 14 is a diagram illustrating the rollback control in the dynamic update unit 811 when the generation of a code word by the error correction fails in this embodiment. As illustrated in (A) of FIG. 14, it is assumed that a plurality of pieces of data 1001, 1002, 1003, and 1004 are inverted by the error correction of column component code words 1012 and 1013. It is assumed that a column component code word 1011 is processed as the error correction target of the error correction unit 323, the error correction fails, and a code word is not generated. The component code dynamic determining unit 812 determines component code words 1011, 1012, and 1013 to be the rollback control target.

The component code dynamic determining unit 812 performs any one of the partial rollback control and the entire rollback control depending on the progress.

(B) of FIG. 14 illustrates a case in which the entire rollback control is performed. As illustrated in (B) of FIG. 14, it can be seen that all inverted data of at least some data forming the component code words 1011, 1012, and 1013 are returned to data forming the code words on which the error correction is not performed.

That is, the dynamic update unit 811 performs the rollback control on data, on which the error correction is performed, of an arbitrary component code word which is one or more of plural component code words in the first direction (the row direction or the column direction) and which includes bits on which the error correction is performed.

(C) of FIG. 14 illustrates a case in which the partial rollback control is performed. As illustrated in (C) of FIG. 14, it can be seen that a part, which duplicates between the component code word 1011 and other component code words 1012 and 1013, among the inverted data included in the component code words 1011, 1012, and 1013 is returned to the data forming the code words on which the error correction is not performed yet.

The dynamic update unit 811 performs the rollback control on a predetermined bit, on which the error correction is performed, of an arbitrary component code word which is one of plural first component code words in the column direction (or the row direction) and does not update data other than the predetermined bit, on which the error correction is performed in the arbitrary component code word.

In this embodiment, a condition for switching the condition for performing the entire rollback control and the condition for performing the partial rollback control is not particularly limited. For example, the conditions may be switched depending on the number of times of iteration. The condition for performing the rollback control including the entire rollback control or the partial rollback control is, for example, a condition that the error correction of another component code word, which includes a bit on which the error correction is performed among plural bits included in one component code word which is one of the plural component code words in the first direction (the column direction or the row direction) and which is one of the plural component code words in the second direction (the column direction or the row direction which is a direction other than the first direction), fails but may be another condition.

In this way, the component code dynamic determining unit 812 performs different rollback control depending on the progress. In this embodiment, the entire rollback control is performed when the number of times of iterated error correction of a component code is less than Threshold value K, and the partial rollback control is performed when the number of times of iterated error correction of a component code is equal to or greater than Threshold value K. Threshold value K is set depending on the embodiments.

In the first embodiment, an example in which the entire rollback control is performed without depending on the progress is described, but the partial rollback control is performed every time when the rollback control is necessary without depending on the progress in a modified example.

In the first embodiment, an example in which one component code word on which the error correction is performed and another component code word having data common to the one component code word are set as the rollback control target. However, the rollback control target is not limited to the component codes, but component codes may be recursively determined.

The component code dynamic determining unit 812 of the second embodiment recursively determines a component code word as a rollback control target based on the order of error correction.

Figure 15:
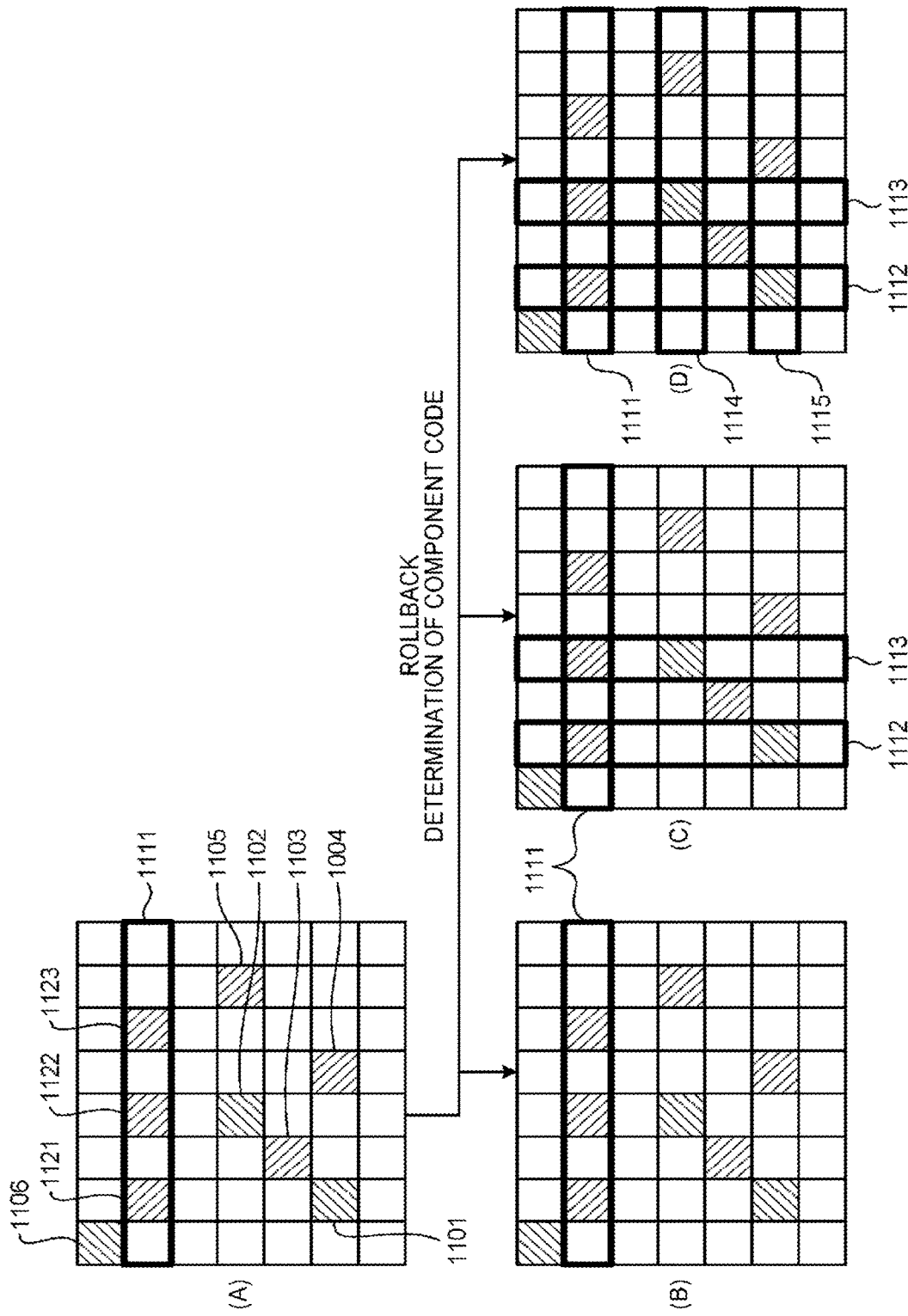
FIG. 15 is a diagram illustrating a flow of recursively determining a component code word to be subjected to rollback control in the component code dynamic determining unit in the second embodiment.

FIG. 15 is a diagram illustrating a flow of recursively determining a component code word to be subjected to the rollback control in the component code dynamic determining unit 812 of the second embodiment. In (A) of FIG. 15, it is assumed that the error correction is performed on a component code word 1111. In this error correction, bit values of pieces of data 1121, 1122, and 1123 included in the component code word 1111 are inverted (corrected). The component code dynamic determining unit 812 recursively determines the rollback control target from the component code word 1111 on which the error correction is performed. In the example illustrated in FIG. 15, it is assumed that the bit values are inverted (corrected) by performing the error correction in the row direction on a plurality of pieces of data 1101, 1102, and 1106, and the bit values are inverted (corrected) by performing the error correction in the column direction on a plurality of pieces of data 1103, 1104, and 1105.

(B) of FIG. 15 illustrates a case in which the number of recursion stages is equal to 0. That is, since the recursion is not performed, the component code dynamic determining unit 812 determines only the component code word 1111 in the row direction as the rollback control target. Accordingly, the number of component codes to be subjected to the rollback control is 1.

(C) of FIG. 15 illustrates a case in which the number of recursion stages is equal to 1. Therefore, the component code dynamic determining unit 812 determines the component code word 1111 in the row direction and the component code words 1112 and 1113 in the column direction which share data having an inverted (corrected) bit value with the component code word 1111 and which includes other data having an inverted (corrected) bit value as the rollback control target. Accordingly, the number of component codes to be subjected to the rollback control is 3.

In this embodiment, when the number of recursion stages is two or more, the received word storage area 311 of the DRAM 27 stores a change history of the component code words forming a product code depending on the number of recursion stages. Since the data 1106 of FIG. 15 is not associated with the recursive rollback control from the plurality of pieces of data 1121, 1122, and 1123 included in the component code word 1111 without depending on the number of recursion stages, the inversion (correction) of bit values is not performed.

(D) of FIG. 15 illustrates a case in which the number of recursion stages is equal to 2. The component code dynamic determining unit 812 determines the component code words 1111, 1112, and 1113 illustrated in (C) of FIG. 15 and the component code words 1114 and 1115 in the row direction which share data having an inverted (corrected) bit value with the component code words 1112 and 1113 in the column direction and which includes other data having an inverted (corrected) bit value as the rollback control target. Accordingly, the number of component code words to be subjected to the rollback control is 5.

In the example illustrated in FIG. 15, the number of recursion stages ranges from 0 to 2, but the number of recursion stages may be 3 or greater.

In this way, the dynamic update unit 811 of this embodiment performs the rollback control on data, on which the error correction is performed, of one component code word when the rollback control condition is satisfied by the error correction of the one component code word which is one of the plural component code words in the first direction (the column direction or the row direction). Then, the dynamic update unit 811 recursively performs the rollback control of data, on which the error correction is performed, of the plural component code words in the second direction (the column direction or the row direction which is a direction other than the first direction) and the rollback control on data, on which the error correction is performed, of the plural component code words in the first direction.

The component code dynamic determining unit 812 of this embodiment determines the number of recursion stages depending on the progress of the iterated correction. In a more specific example, the number of recursion stages is determined depending on whether the number of times of iterated error correction of a component code word is equal to or greater than a threshold value set for each recursion stage.

The component code dynamic determining unit 812 does not limit the number of recursion stages when the number of times of iterated error correction of a component code word is less than Threshold value A'. The component code dynamic determining unit 812 sets the number of recursion stages to 2 when the number of times of iterated error correction of a component code word is equal to or greater than Threshold value A' and less than Threshold value B'. The component code dynamic determining unit 812 sets the number of recursion stages to 1 when the number of times of iterated error correction of a component code word is equal to or greater than Threshold value B' and less Threshold value C'. The component code dynamic determining unit 812 sets the number of recursion stages to 0, that is, does not recursively perform the rollback control when the number of times of iterated error correction of a component code word is equal to or greater than Threshold value C'.

In this way, the dynamic update unit 811 of this embodiment recursively iterates a process of updating first data included in a first code word which is a component code word in one direction among component code words in the row direction and the column direction forming a product code to second data on which the error correction is not yet performed, and then updating arbitrary data included in a second code word on which the error correction is performed before the first code word on which the error correction is performed to data on which the error correction is not yet performed based on a predetermined number of recursion stages.

In this embodiment, the number of times of recursion is first set to be great so as to improve the certainty of the error correction. Thereafter, by slowly decreasing the number of times of recursion, a processing load caused in the recursion is reduced. Accordingly, in this embodiment, it is possible to make improvement in certainty of error correction and reduction in processing load compatible with each other.

Whether the partial rollback control should be performed or the entire rollback control should be performed after the component code to be subjected to the rollback control is recursively determined is not particularly limited, but may be determined depending on the progress of the iterated correction.

Figure 16:
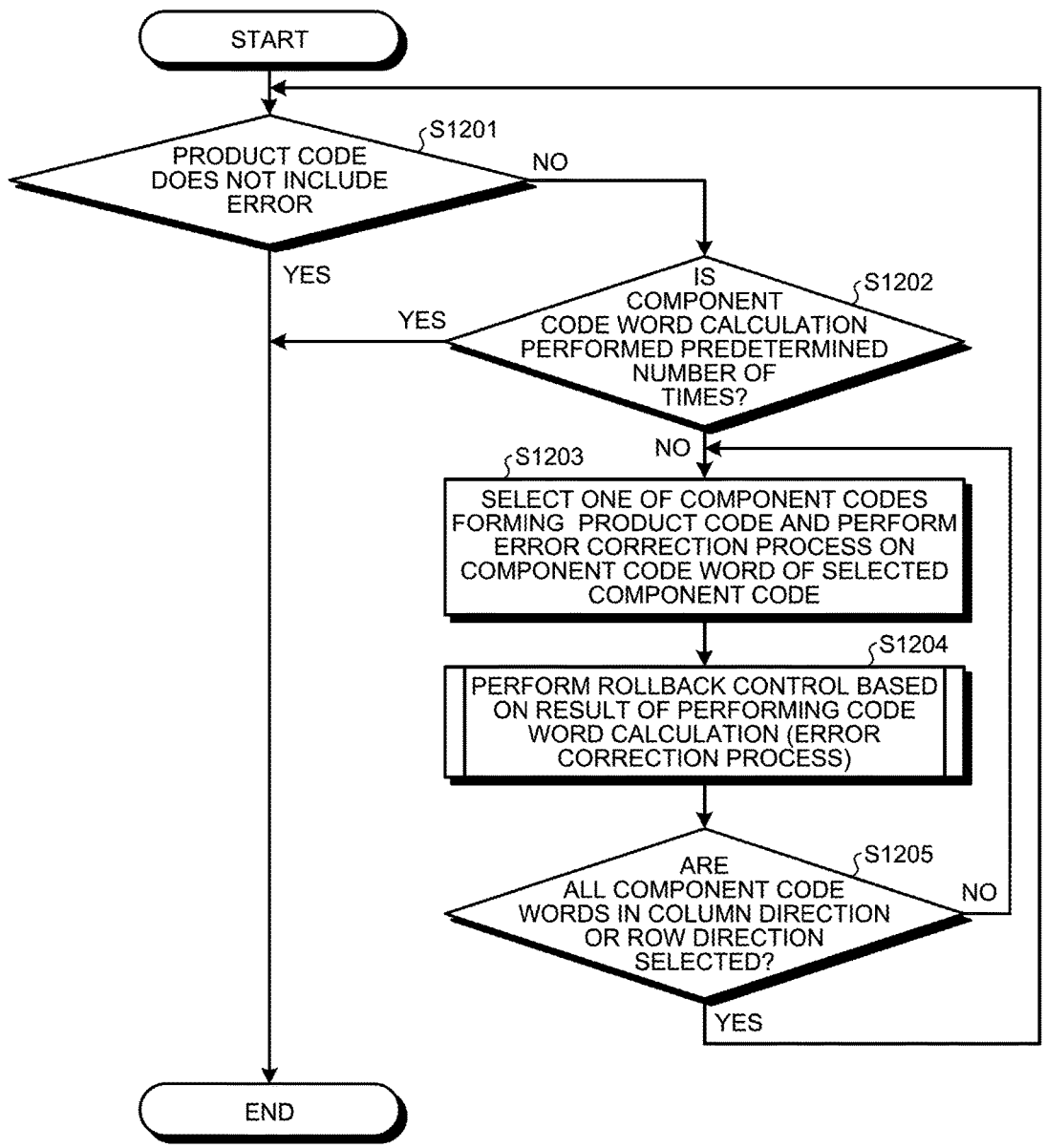
FIG. 16 is a flowchart illustrating a process flow up to rollback control in a memory controller according to the second embodiment.

The process flow up to the rollback control in the memory controller 2 according to this embodiment will be described below. FIG. 16 is a flowchart illustrating the process flow in the memory controller 2 according to this embodiment. Before the process flow illustrated in FIG. 16, it is assumed that a product code stored in the nonvolatile memory 3 is loaded to the received word storage area 311 and then the product code is copied to the updated code word storage area 312 in accordance with a command from the host 4.

First, the error correction unit 323 of the decoder unit 26 determines whether the product code stored in the updated code word storage area 312 does not include an error (S1201). In S1201 of the first time, for example, all the component code words in the row direction are decoded and it is determined whether the product code does not include an error based on information on error presence or absence acquired by the decoding. When the error correction unit 323 determines that the product code does not include an error (YES in S1201), the process flow ends.

On the other hand, when the error correction unit 323 of the decoder unit 26 determines that the product code includes an error (NO in S1201), the error correction unit 323 determines whether calculation (error correction process) of the component codes in the column direction and the row direction on the product code is performed a predetermined number of times (S1202). The predetermined number of times may be determined for the number of times of calculation of the component codes with calculation both component codes in the column direction and the row direction as a set, or may be determined for the total number of times of calculation of the component codes. The predetermined number of times is determined depending on the performance of the nonvolatile memory 3 or the embodiments, and thus description thereof will not be made. When it is determined that the calculation of component code words is performed the predetermined number of times (YES in S1202), the process flow ends.

On the other hand, when the error correction unit 323 determines that the calculation of code words on the product code is not performed the predetermined number of times (NO in S1202), one (the row direction or the column direction) of the component codes forming the product code is selected and the error correction process (code word calculation) of the component code words of the selected component code is performed (S1203).

The decoder unit 801 performs the rollback control based on the result of performing the code word calculation (error correction process) (S1204). The detailed process flow will be described later.

The error correction unit 323 determines whether all the component code words in the column direction or the row direction are selected (S1205). When it is determined that all the component code words in the column direction or the row direction are not selected (NO in S1205), the process flow from S1203 is performed. On the other hand, when it is determined that all the component code words in the column direction or the row direction are selected (YES in S1205), the process flow from S1201 is performed.

Based on the above-mentioned process flow, since the rollback control is performed after the code word calculation (error correction process), it is possible to enhance the probability that correct user data can be acquired.

Figure 17:
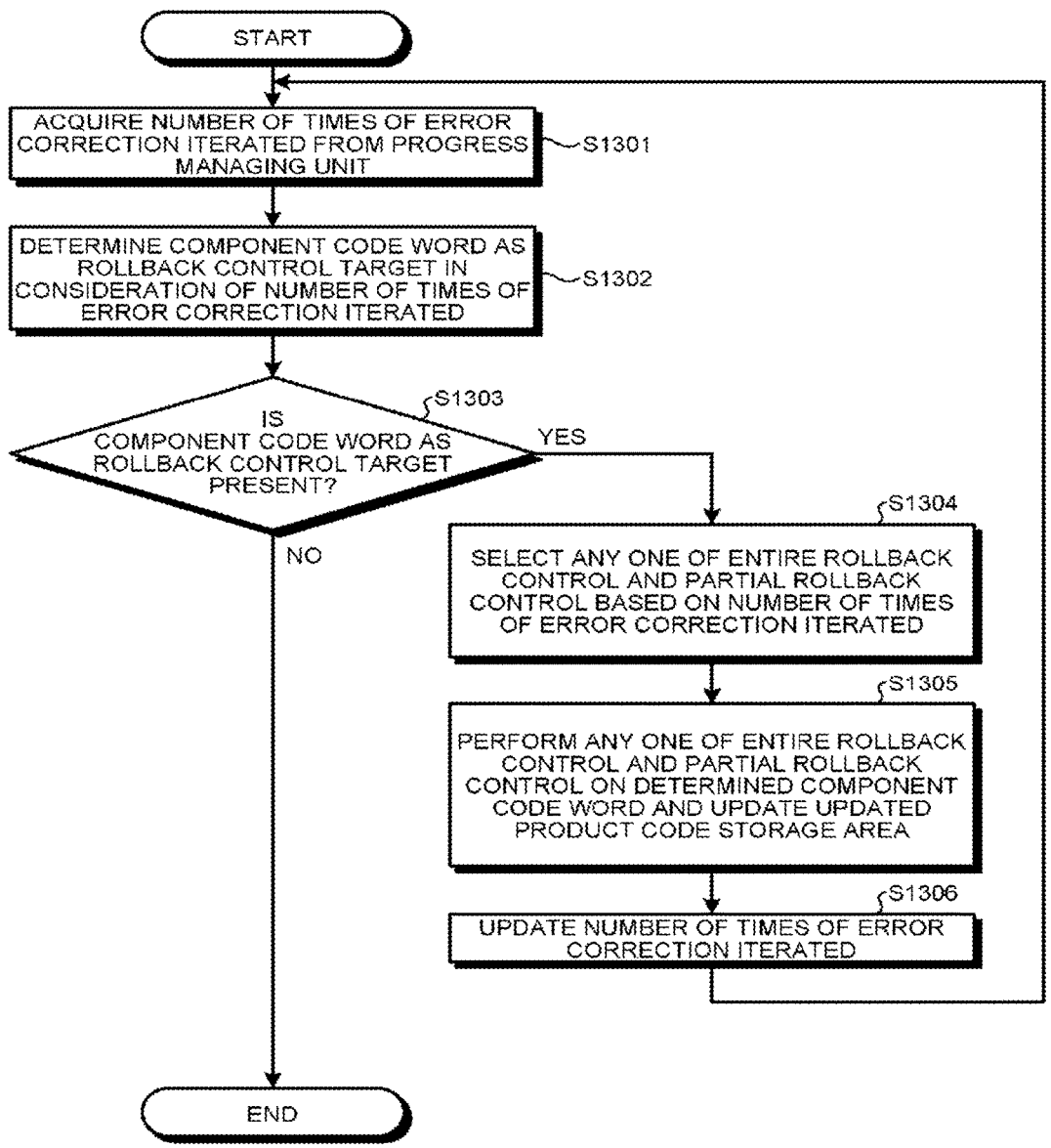
FIG. 17 is a flowchart illustrating a rollback control flow in a decoder unit in the second embodiment.

The rollback control illustrated in S1204 in the decoder unit 801 of this embodiment will be described below. FIG. 17 is a flowchart illustrating the process flow in the decoder unit 801 of this embodiment.

First, the component code dynamic determining unit 812 acquires the number of times of iterated error correction from the progress managing unit 813 (S1301).

Then, the component code dynamic determining unit 812 determines a component code word to be subjected to the rollback control based on the number of times of iterated error correction (S1302). For example, the component code word to be subjected to the rollback control is determined in consideration of the inversion number besides the number of times of iterated error correction, or the component code word to be subjected to the rollback control is determined based on the number of recursion stages based on the number of times of iterated error correction.

Then, the dynamic update unit 811 determines whether a component code word to be subjected to the rollback control is present (S1303). When it is determined that the component code word is not present (NO in S1303), the process flow ends.

On the other hand, when it is determined that the component code word to be subjected to the rollback control is present (YES in S1303), the dynamic update unit 811 acquires the number of times of iterated error correction from the progress managing unit 813 and selects one of the entire rollback control and the partial rollback control based on the number of times of iterated error correction (S1304).

Then, the dynamic update unit 811 performs the selected one of the entire rollback control and the partial rollback control on the component code word to be subjected to the rollback control and updates the updated code word storage area 312 (S1305). Accordingly, the rollback control on the component code words of the component codes of the product code stored in the updated code word storage area 312 is performed.

Then, the dynamic update unit 811 updates the number of times of iterated error correction of the progress managing unit 813 (S1306) and restarts the process flow from S1301.

Based on the above-mentioned process flow, the rollback control can be performed depending on the progress of the number of times of iteration.

The second embodiment is not limited to the above-mentioned control, but the method of determining a component code may be changed depending on the progress of the number of times of iteration.

For example, the rollback control when calculation for the error correction of a component code word succeeds and a code word is generated and the rollback control when the code word calculation (error correction process) of a component code word fails and a code word is not generated may be selected depending on the progress of the iterated correction.

Specifically, 1) a component code word to be subjected to the rollback control is determined in both cases of a case in which the code word calculation (error correction process) of a component code word succeeds and a code word is generated and a case in which the code word calculation (error correction process) of a component code word fails and a code word is not generated.

2) The rollback control is not performed and a component code word to be subjected to the rollback control is not determined in both cases of the case in which the code word calculation (error correction process) succeeds and a code word is generated and a case in which the code word calculation (error correction process) fails and a code word is not generated.

3) A component code word to be subjected to the rollback control is determined in only the case in which the code word calculation (error correction process) succeeds and a code word is generated.

4) A component code word to be subjected to the rollback control is determined in only the case in which the code word calculation (error correction process) fails and a code word is not generated.

For example, the component code dynamic determining unit 812 may dynamically select one of 1) to 4) depending on the progress of the iterated correction.

The rollback control in the case in which the code word calculation (error correction process) succeeds and a code word is generated may be performed in various aspects in which a change of another component code word is accompanied or the inversion number exceeds the reference number. Therefore, in this embodiment, determination of a component code word to be subjected to the rollback control may be switched in the aspects depending on the progress of the number of times of iteration.

Specifically, 5) a component code word to be subjected to the rollback control is determined in both cases of a case in which a change of another component code word is accompanied and a case in which the inversion number exceeds the reference number.

6) The rollback control is not performed and a component code word to be subjected to the rollback control is not determined in both cases of the case in which a change of another component code word is accompanied and the case in which the inversion number exceeds the reference number.

7) A component code word to be subjected to the rollback control is determined in only the case in which a change of another component code word is accompanied.

8) A component code word to be subjected to the rollback control is determined in only the case in which the inversion number exceeds the reference number.

In the second embodiment, the component code dynamic determining unit 812 may dynamically select any one of 1) to 8) depending on the progress of the iterated correction when the rollback control is performed in the case in which the code word calculation (error correction process) succeeds and a code word is generated.

In the above embodiment, it is possible to enhance a success rate of error correction of an entire product code by performing rollback control on a component code having a high possibility that erroneous correction occurs.

However, when the rollback control is performed on a component code word in which erroneous correction does not occur, there is a possibility that the iterated correction will not proceed.

Therefore, in this embodiment, one or more of the method of determining a component code word to be subjected to the rollback control and the rollback control method is dynamically changed depending on the progress of the iterated correction. Accordingly, it is possible to make enhancement in the success rate of error correction and suppression of the possibility that the iterated correction will not proceed compatible with each other.

In the above embodiment, the control of discarding data having a high possibility that it is erroneous among the error correction results and updating the data to data on which the error correction is not yet performed by performing the above-mentioned control. Accordingly, it is possible to reduce the erroneous correction.

Accordingly, in the above embodiment, it is possible to enhance a success probability of the error correction of a product code by reducing the erroneous correction.

Third Embodiment

In the above embodiments, a case in which the data stored in the received word storage area 311 is a code word read from the nonvolatile memory 3, that is, a code word before being subjected to the error correction has been exemplified. However, the present invention is not limited to the embodiments. For example, such a configuration is possible that a part or all of the component codes forming the code word stored in the received word storage area 311 are replaced by a component code word while being decoded, which is generated in a course of the iterated decoding process in which the error correction is iterated.

Therefore, in the third embodiment, a case in which the code word stored in the received word storage area 311 is not limited to the code word before being subjected to the error correction will be described in detail with reference to the drawings. Description below is based on the first embodiment among the above embodiments, but is not limited to the first embodiment and can be similarly applied to the second embodiment. In the description below, the same elements as in the above embodiments will be referenced by the same reference numerals and description thereof will not be repeated.

Figure 18:
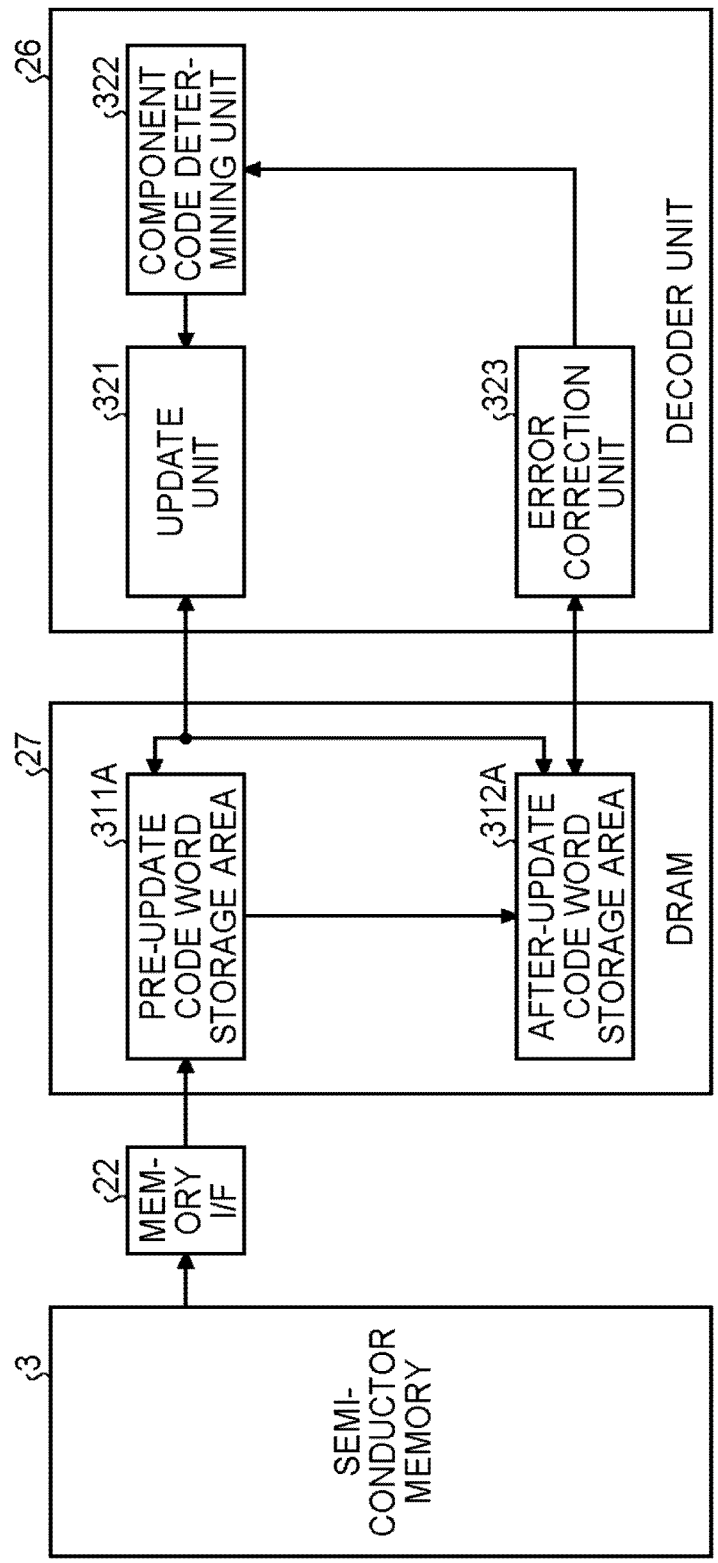
FIG. 18 is a block diagram illustrating configurations of a decoder unit and a DRAM according to a third embodiment.

FIG. 18 is a block diagram illustrating configurations of the decoder unit 26 and the DRAM 27 according to the third embodiment. As illustrated in FIG. 18, the decoder unit 26 has the same configuration, for example, as the decoder unit 26 described with reference to FIG. 4. Meanwhile, in the DRAM 27, a pre-update code word storage area 311A and an after-update code word storage area 312A are provided.

The after-update code word storage area 312A stores therein a code word acquired by performing the component code word calculation on the code word stored in the pre-update code word storage area 311A, as in the updated code word storage area 312 in the above embodiments. That is, the cord word stored in the after-update code word storage area 312A is sequentially updated by the component code word having been subjected to error correction in the course of the iterated decoding process. In the description below, the data sequentially updated in the course of the iterated decoding process, in other words, the data while being decoded is referred to as "intermediate decoded word". Therefore, the intermediate decoded word in this embodiment is a code word sequentially updated by the component code word having been subjected to error correction in the course of the iterated decoding process.

The pre-update code word storage area 311A is a memory that holds information required for the rollback process. In this embodiment, as in the received word storage area 311 in the above embodiments, the pre-update code word storage area 311A temporarily stores therein a code word (received word) on which error correction is not yet performed, which is read from the nonvolatile memory 3 in response to the reading command via the memory I/F 22. However, the code word stored in the pre-update code word storage area 311A is updated by the component code word having been subjected to error correction appropriately in the course of the iterated decoding process. That is, in the course of the iterated decoding process, a code word while being decoded, before completion of error correction, is stored in the pre-update code word storage area 311A. In the description below, the information required for the rollback process is referred to as "recurrence information". Therefore, the recurrence information in this embodiment is a code word (product code) while being decoded, before completion of error correction.

However, it is preferred that the data to be used for update of the recurrence information (code word) stored in the pre-update code word storage area 311A is not added with an unnecessary error by error correction. That is, it is preferred that the recurrence information stored in the pre-update code word storage area 311A is composed of a component code word that is not required to be rolled back to the earlier state. Therefore, in this embodiment, the recurrence information stored in the pre-update code word storage area 311A is updated by a component code word having a high possibility of not including an error bit.

Figure 19:
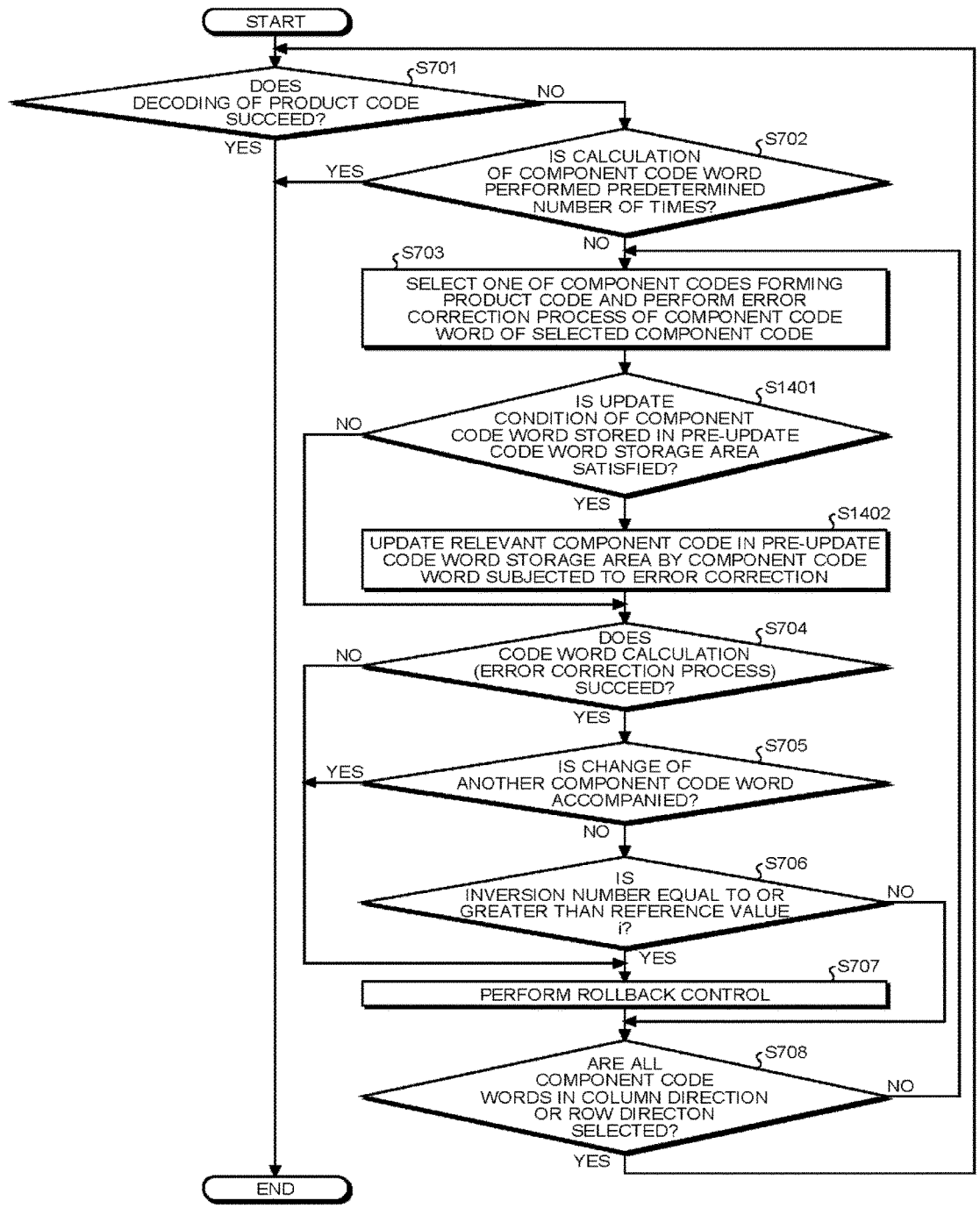
FIG. 19 is a flowchart illustrating a process flow up to rollback control in a memory controller according to the third embodiment.

Subsequently, a process up to the rollback control in the memory controller 2 according to this embodiment will be described. FIG. 19 is a flowchart illustrating a process flow up to the rollback control in the memory controller 2 according to this embodiment. Before the process flow illustrated in FIG. 19, it is assumed that a product code stored in the nonvolatile memory 3 is loaded to the pre-update code word storage area 311A in response to a command from the host 4 and then the product code is copied to the after-update code word storage area 312A.

As illustrated in FIG. 19, in the process flow, the error correction unit 323 determines whether decoding of the product code (intermediate decoded word) stored in the after-update code word storage area 312A has succeeded by the same operation as that illustrated in Steps S701 to S703 illustrated in FIG. 11 (S701). When it is determined that the decoding has not succeeded yet (NO in S701), the error correction unit 323 determines whether calculation of component code words (error correction process) in the column direction and the row direction has been performed on the product code a predetermined number of times (S702). When the error correction unit 323 determines that the component code word calculation on the product code has not been performed the predetermined number of times (NO in S702), one (the row direction or the column direction) of the component codes forming the product code is selected and the error correction process (code word calculation) on component code words of the selected component code is performed (S703). In Step S701, when the error correction unit 323 determines that the product code does not include an error (YES in S701), or that the component code word calculation on the product code has been performed the predetermined number of times (YES in S702), the process flow ends.

When the error correction process on the component code words of the component code selected in Step S703 (code word calculation) is complete, the error correction unit 323 confirms an update condition for determining whether to update the relevant component code words in the recurrence information (product code) stored in the pre-update code word storage area 311A by the component code words subjected to error correction by the error correction process, and decides whether the update condition is satisfied (S1401). As the update condition, it is possible to use a condition that "a Hamming distance between the data before update and the data after update is equal to or less than a preset threshold" or the like. However, the update condition is not limited to such a condition, and various conditions can be applied so long as the condition can sufficiently ensure the reliability on that the component code word having been subjected to error correction does not include an error.

When it is determined that the update condition is satisfied in Step S1401 (YES in Step S1401), the error correction unit 323 updates the relevant component code word in the recurrence information stored in the pre-update code word storage area 311A by the component code word subjected to error correction by the error correction process (S1402), and the process flow proceeds to Step S704. On the other hand, when it is determined that the update condition is not satisfied (NO in Step S1401), the error correction unit 323 does not update the recurrence information stored in the pre-update code word storage area 311A, and the process flow proceeds to Step S704.

Hereinafter, for example, by performing the same operation as the operation illustrated in Steps S704 to S708 in FIG. 11, the error correction process including the rollback control according to this embodiment is performed.

As described above, according to this embodiment, as in the above embodiments, when the error correction is performed or when calculation for performing the error correction fails, the rollback control for returning the component code word to the state before rewriting is performed. Therefore, the probability of acquiring correct user data can be improved. Further, in this embodiment, because the recurrence information (product code) stored in the pre-update code word storage area 311A is updated by component code words having high reliability, that is, having less possibility of including an error bit in the course of the iterated decoding process in which error correction is iterated, the decoding process can be completed with less calculation amount within a short period of time. Because other configurations, operations, and effects are identical to those of the above embodiments, detailed descriptions thereof will not be repeated.

In the respective embodiments described above, the product code that doubly protects the user data by two-dimensional component codes of the component codes in the column direction and the component codes in the row direction has been illustrated. However, the present disclosure is not limited to such a product code. That is, in the respective embodiments described above and the respective embodiments described below, the code to be used is not limited to the product code, and a code that protects at least a part of the user data more than doubly by the component codes in the form of two-dimensional or more can be used. In the description below, codes that protect the user data at least a part of doubly or more by the component codes in the form of two-dimensional or more, including the above-described product code, Graph codes being a concept of generalizing the product code, and generalized LDPC codes (Generalized Low-Density Parity Check codes) being a concept of generalizing the Graph codes, are referred to as "multi-dimensional error correction code". In generalized LDPC codes, it is considered that each component code has its own dimension. Thus, different component codes belong to different dimensions in a generalized LDPC code. The multi-dimensional error correction code may include a plurality of component code words as in the product code described above.

In the above embodiments, it is configured such that the received word storage area 311 or the pre-update code word storage area 311A holds cord words (recurrence information) having the same code length as the code words read from the nonvolatile memory 3. However, the configuration is not limited thereto. For example, the received word storage area 311 or the pre-update code word storage area 311A can be configured to store therein difference data between the cord words (intermediate decoded word) stored in the updated code word storage area 312 or the after-update code word storage area 312A and the code words (recurrence information) stored in the received word storage area 311 or the pre-update code word storage area 311A in the description above. Alternatively, it is possible to configure the received word storage area 311 or the pre-update code word storage area 311A to hold necessary and sufficient information for uniquely calculating the difference data (for example, a syndrome value). By having such a configuration, the memory area required for the received word storage area 311 or the pre-update code word storage area 311A can be reduced.

Fourth Embodiment

Subsequently, a memory controller, a memory system and a control method according to a fourth embodiment will be described below in detail with reference to the drawings. In the description below, the same elements as in the above embodiments will be referenced by the same reference numerals and description thereof will not be repeated.

The above embodiments and the embodiments described below relate to a decoding method of an error correction code that protects at least one symbol by a plurality of component codes, and are applicable not only to the product code but also to various error correction codes having characteristics of performing multiplex coding on a certain symbol by a plurality of component codes.

The symbol used in the description is described. The symbol is a unit of information. In the simplest example, one symbol corresponds to one bit. The code word of the error correction code is generally a vector in which the symbols are aligned. For example, a symbol of binary BCH codes is a bit (binary information of "0" or "1"), and a symbol of RS codes is an element of a finite field.

Figure 20:
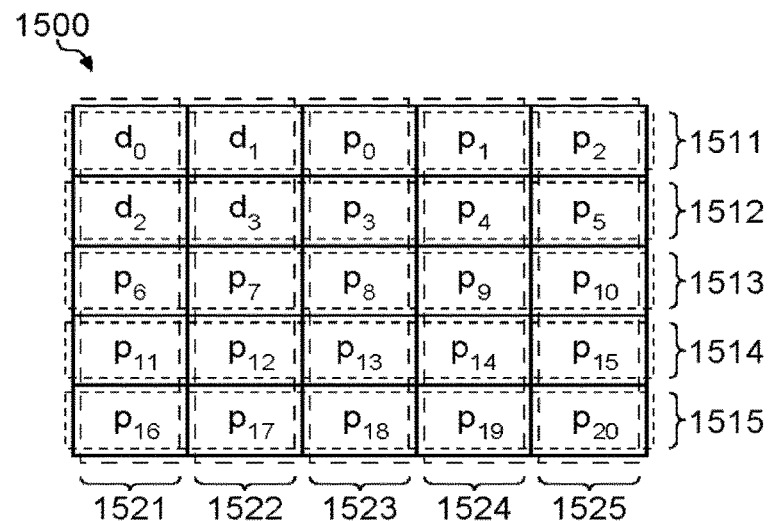
FIG. 20 is a diagram illustrating a schematic configuration example of a multi-dimensional error correction code to be used as an example in a fourth embodiment.

A multi-dimensional error correction code to be used as an example in this embodiment will be described next. FIG. 20 is a diagram illustrating a schematic configuration example of the multi-dimensional error correction code to be used as an example in this embodiment. As illustrated in FIG. 20, as the multi-dimensional error correction code to be used as an example in this embodiment, a product code 1500 having a code length of 25 symbols and an information length (a data length of user data) of 4 symbols can be exemplified. The product code 1500 includes, for example, data symbols $d_0$, $d_1$, $d_2$ and $d_3$, and parity symbols $p_0$ to $p_{20}$. Hereinafter, for simplifying the description, a case in which the product code 1500 is adopted as the multi-dimensional error correction code, in which the BCH code is used for the component code including binary bit information of "0" and "1" is illustrated. However, when the RS code having the number of corrected symbols of 1 is adopted as the component code, the symbol in this description is an element of a Galois field.

In the product code 1500 having the code structure as illustrated in FIG. 20, the data symbols $d_0$ to $d_3$ and the parity symbols $p_0$ to $p_{20}$ are doubly protected respectively by ten component codes 1511 to 1515 and 1521 to 1525. For example, the component code 1511 encodes the data symbols $d_0$ and $d_1$ and the parity symbols $p_0$ to $p_2$. Therefore, when focusing on the data symbol $d_0$, the data symbol $d_0$ is doubly protected by the component code 1511 and the component code 1521 simultaneously. Similarly, the respective symbols $d_1$ to $d_3$ and $p_0$ to $p_{20}$ other than the data symbol $d_0$ are doubly encoded by the component codes 1511 to 1515 in the row direction and the component codes 1521 to 1525 in the column direction, thereby being doubly protected simultaneously. In the description below, the row direction and the column direction may be called one "dimension" respectively.

Figure 21:
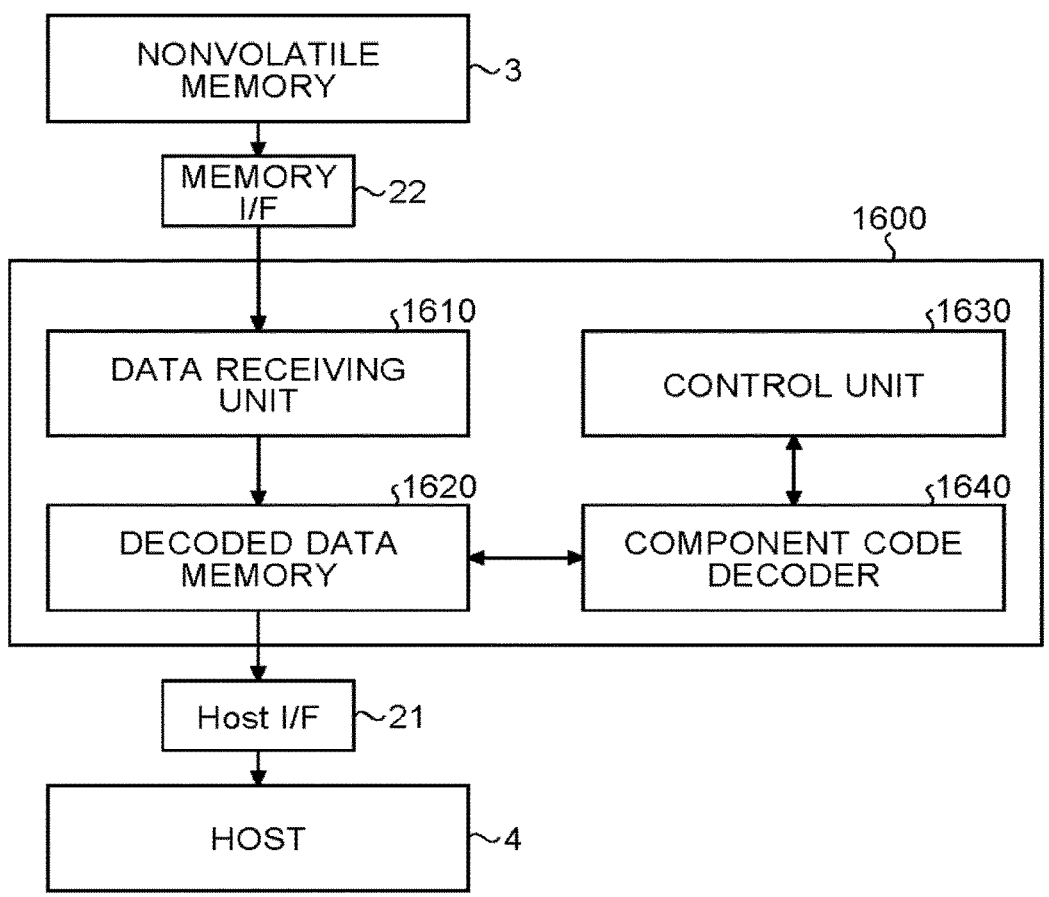
FIG. 21 is a block diagram illustrating a schematic configuration example of a decoder exemplified in the fourth embodiment.

As a representative decoding method framework with respect to the multi-dimensional error correction code having a code structure similar to that of the product code 1500 described above, there is an iterated decoding process that iterates error correction as described in the above embodiments. FIG. 21 illustrates a schematic configuration example of a decoder that performs the iterated decoding process again. As illustrated in FIG. 21, an illustrative decoder 1600 includes, for example, a data receiving unit 1610, a decoded data memory 1620, a control unit 1630 and a component code decoder 1640. The decoder 1600 can be a decoder functionally realized in respective units of the memory controller 2, for example, illustrated in FIG. 1. Hereinafter, for clarifying the description, a case in which the product code 1500 illustrated in FIG. 20 is used as the multi-dimensional error correction code will be described as an example.

The data receiving unit 1610 may be a memory area secured in, for example, the DRAM 27 (see FIG. 1), or a memory area provided in the encoder/decoder unit 24. The decoded data memory 1620 receives the product code 1500 read from the nonvolatile memory 3 by the memory I/F 22 and records the product code 1500 therein. The data receiving unit 1610 also records information required for decoding, which is calculated based on the product code 1500, in the decoded data memory 1620, in addition to the received product code 1500. The information required for decoding can be, for example, a syndrome value of the respective component codes calculated based on the product code 1500. In the description below, the product code 1500 and the information required for decoding (the syndrome value and the like) may be collectively and simply referred to as "data".

The control unit 1630 corresponds to, for example, the processor 23 (see FIG. 1), and performs the iterated decoding process of rewriting the data in the decoded data memory 1620 by using the component code decoder 1640. The component code decoder 1640 corresponds to, for example, the decoder unit 26 of the encoder/decoder unit 24, and outputs information relating to an error symbol present in the component code word based on the component code word read from the decoded data memory 1620 for each component code. The control unit 1630 rewrites the product code 1500 in the decoded data memory 1620 based on the information relating to the error symbol to be output by the component code decoder 1640.

Figure 22:
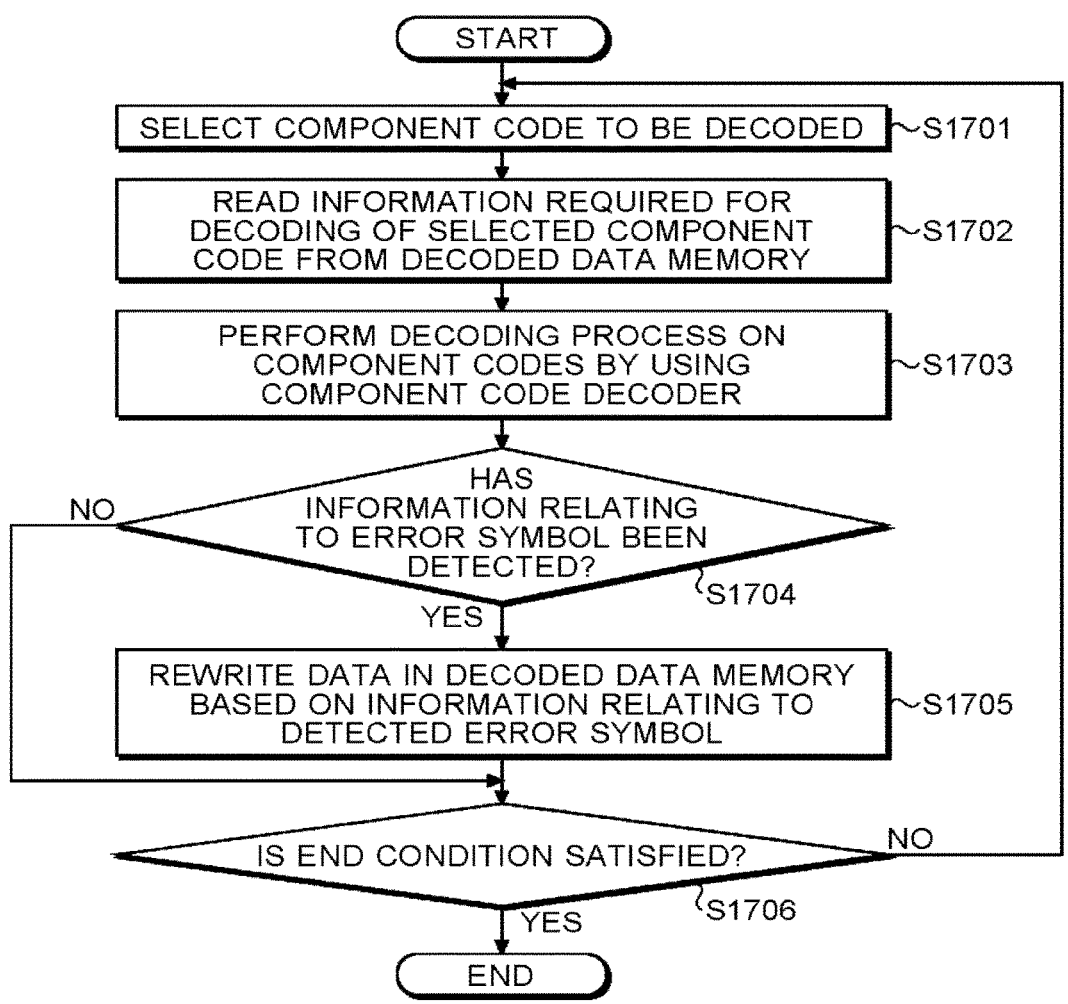
FIG. 22 is a flowchart illustrating an example of an iterated decoding process performed by a decoder exemplified in FIG. 21.

The iterated decoding process performed by the illustrative decoder 1600 illustrated in FIG. 21 will be described next in detail with reference to FIG. 22. FIG. 22 is a flowchart illustrating an example of the iterated decoding process performed by the illustrative decoder. It is assumed that before the process flow illustrated in FIG. 22, the product code 1500 (see FIG. 20) read from the nonvolatile memory 3 has been stored in the decoded data memory 1620 in response to a command from the host 4. In FIG. 22, the process flow is described, focusing on the operation of the control unit 1630.

As illustrated in FIG. 22, the control unit 1630 first selects a component code to be decoded from the component codes 1511 to 1515 and 1521 to 1525 forming the product code 1500 (Step S1701). At this time, the control unit 1630 can repeatedly perform selecting the component codes 1511 to 1515 from the component code 1511 being a top in the row direction sequentially along the column direction, for example, among the component codes 1511 to 1515 and 1521 to 1525 forming the product code 1500, and thereafter, selecting the component codes 1521 to 1525 from the component code 1521 being a top in the column direction sequentially along the row direction. However, the selection order of the component code to be decoded is not limited to this order. The selection order can be variously modified to be, for example, a selection order in which a component code in the row direction and a component code in the column direction are alternately selected one by one, or a selection order in which a component code is selected at random by using a pseudo random number or the like.

Next, the control unit 1630 reads the information required for decoding of the component code from the decoded data memory 1620, regarding the component code selected as a decoding target (Step S1702). The information required for decoding of the component code may be, for example, a syndrome value in the data recorded in the decoded data memory 1620, of the respective component codes calculated based on the product code 1500.

Next, the control unit 1630 then inputs the information required for decoding, which is read in Step S1702, to the component code decoder 1640, and instructs the component code decoder 1640 to perform the decoding process on the component code selected in Step S1701 (Step S1703). The decoding process performed by the component code decoder 1640 can be bounded distance decoding based on, for example, the syndrome value of the component code. In this case, the information required for decoding input to the component code decoder 1640 is a syndrome value, and the information to be output as a result of the decoding process by the component code decoder 1640 is information of the position and the value of an error symbol (corresponding to the information relating to the error symbol described above).

The bounded distance decoding is a decoding method having such a characteristic that a certain number of error symbols (also referred to as "correctable number") can be always corrected. For example, the BCH code and the RS code have an advantage such that the decoding method having a characteristic that a certain number of error symbols can be always corrected, such as the bounded distance decoding can be performed with a relatively small amount of calculation. Therefore, it is considered that it is effective to adopt the bounded distance decoding as the decoding method when using the BCH code and the RS code. However, the bounded distance decoding is only an example, and the decoding method is not limited to the bounded distance method, and various decoding methods can be adopted.

Next, the control unit 1630 determines whether the information relating to the error symbol has been detected from the component code, as a result of the decoding process performed by the component code decoder 1640 (Step S1704). When the information relating to the error symbol has been detected (YES in Step S1704), the control unit 1630 rewrites the relevant symbol value in the product code 1500 in the decoded data memory 1620 based on the detected information relating to the error symbol (Step S1705), and the control unit 1630 proceeds to Step S1706. On the other hand, when the information relating to the error symbol has not been detected (NO in Step S1704), the control unit 1630 directly proceeds to Step S1706.

In Step S1706, the control unit 1630 determines whether the end condition of the iterated decoding process is satisfied. When the end condition is not satisfied (NO in Step S1706), the control unit 1630 returns to Step 31701 to select the next component code as a new decoding target, and performs the operation in Step S1702 and thereafter. On the other hand, when the end condition is satisfied (YES in Step S1706), the control unit 1630 finishes the operation. As the end condition of the iterated decoding process, for example, it can be used that the syndrome check of all the component codes has succeeded, that is, it is determined that all the component codes do not include an error.

In the above description, the decoding method described by using FIG. 21 and FIG. 22 can achieve generally excellent error correction capability, because the decoding process proceeds while the component codes having a relatively short code length cooperate with each other. However, if relatively lots of errors are included in the received data, the decoding process on the component codes having a relatively short code length tends to cause a phenomenon referred to as so-called "erroneous correction" in which the code word is decoded to an erroneous code word. If erroneous correction occurs during the iterated decoding and a result thereof is reflected in the decoded data memory 1620, the progress of the iterated decoding stops, and as a result, there is a possibility of decoding failure.

As a method of decreasing the occurrence of decoding failure due to erroneous correction, the rollback control of rolling back (turning) the erroneously corrected component code and the component code failed in calculation to the component codes in the state before the erroneous correction or failed calculation is performed, as described in the above embodiments, is effective. However, in the above embodiments, a memory area (the received word storage area 311 and the pre-update code word storage area 311A) that stores the recurrence information (product code) cited at the time of rollback control is required, in addition to the memory area (the updated code word storage area 312 and the after-update code word storage area 312A) that stores the component codes to be decoded (product code and the like). Therefore, a relatively large memory area is required in total. Therefore, in this embodiment, examples of the memory controller, the memory system and the control method that can decrease the required memory area will be described, while using the concept of rolling back (returning) the erroneously corrected component code and the component code failed in calculation to the component codes in the state before the erroneous correction or failed calculation is performed.

Figure 23:
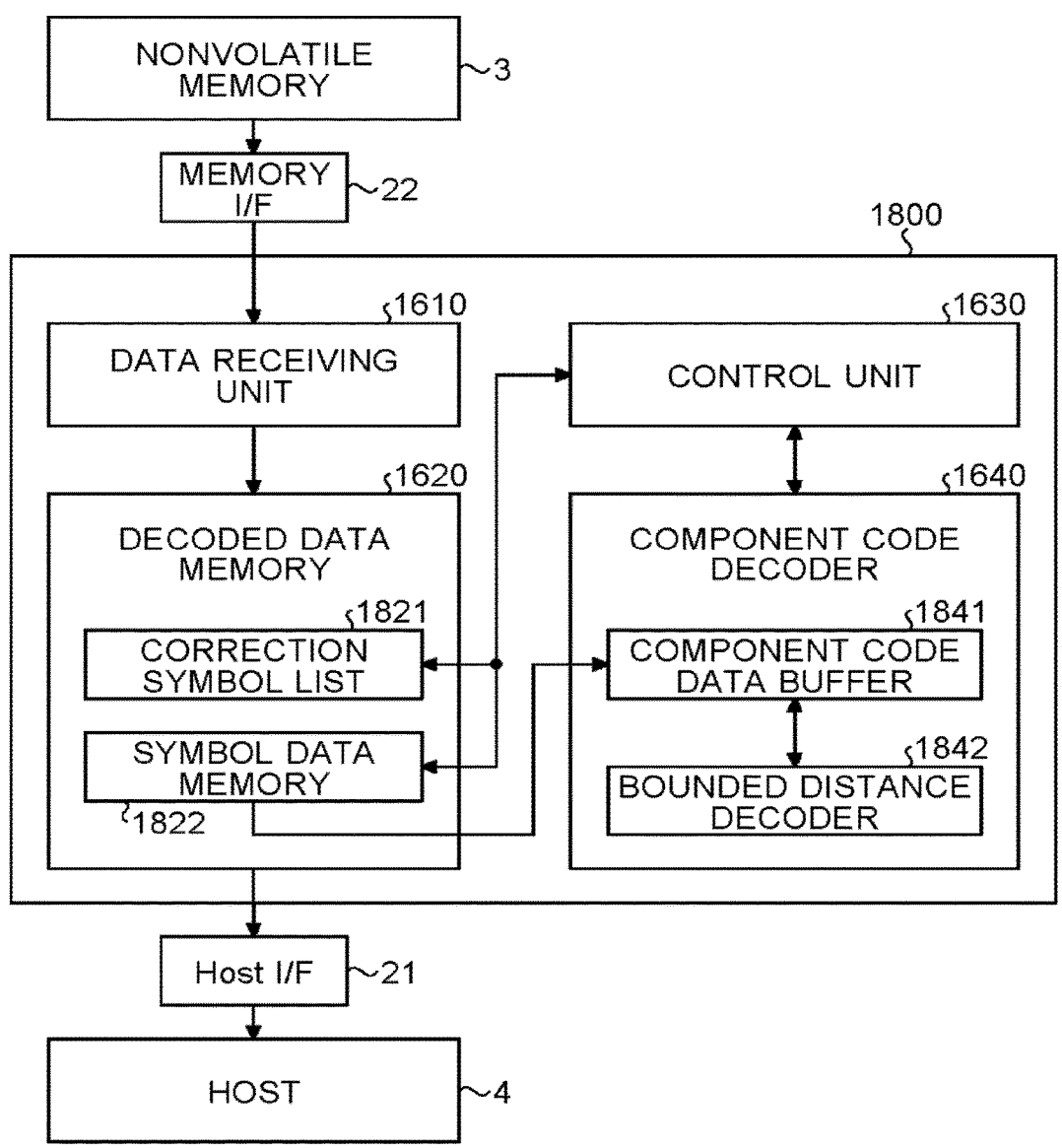
FIG. 23 is a block diagram illustrating a schematic configuration example of the decoder according to the forth embodiment.

FIG. 23 is a block diagram illustrating a schematic configuration example of a decoder according to this embodiment. A decoder 1800 illustrated in FIG. 23 can be, for example, a decoder functionally realized in the respective units of the memory controller 2 illustrated in FIG. 1, as in the decoder 1600 illustrated in FIG. 21.

As illustrated in FIG. 23, the decoder 1800 includes the same configuration, for example, as the decoder 1600 illustrated in FIG. 21. However, in the decoder 1800, a correction symbol list (recurrence information holding unit) 1821 and a symbol data memory (intermediate decoded word memory) 1822 are arranged in the decoded data memory 1620, and a component code data buffer 1841 and a bounded distance decoder 1842 are provided in the component code decoder 1640.

The symbol data memory 1822 in the decoded data memory 1620 is a memory that holds the data while being decoded, that is, the intermediate decoded word, and corresponds to the updated code word storage area 312 or the after-update code word storage area 312A in the above embodiments. Therefore, the symbol data memory 1822 holds the product code 1500 read from the nonvolatile memory 3. It is assumed that the symbol data memory 1822 holds the product code 1500 in a unit of bit.

The product code 1500 (intermediate decoded word) in the symbol data memory 1822 is updated (partially rewritten) by a component code word while being decoded in which the error correction process has not yet been completed, during the iterated decoding process performed by the control unit 1630 by using the component code decoder 1640. In other words, the product code 1500 in the symbol data memory 1822 is successively updated (partially rewritten) by the component code word sequentially acquired as a result of calculation (bounded distance decoding) performed on an individual component code word by the component code decoder 1640.

The correction symbol list 1821 is a memory that holds the recurrence information required for the counter process described later (corresponding to the rollback process in the above embodiments). In this embodiment, the correction symbol list 1821 is a memory that records rewriting log (corresponding to rewriting log information described later), when the control unit 1630 partially rewrites the product code 1500 in the symbol data memory 1822 in response to the result of the decoding process performed on the individual component code word by the component code decoder 1640. That is, the recurrence information in this embodiment is the rewriting log (rewriting log information) when the control unit 1630 partially rewrites the product code 1500 (intermediate decoded word) in the symbol data memory 1822 in response to the result of the decoding process. The rewriting log information is information necessary and sufficient for reproducing the information relating to the error symbol detected by the decoding process (bounded distance decoding) on the respective component codes. Therefore, the correction symbol list 1821 in this embodiment can be said to be a memory that holds recurrence information necessary and sufficient for reproducing the information relating to the error symbol detected by the decoding process (bounded distance decoding) on the respective component codes.

Specifically, when a symbol error has been found in a component code word by the bounded distance decoding performed by using, for example, the component code decoder 1640, the control unit 1630 rewrites a value of the symbol (symbol value) present at a position corresponding to the symbol determined as the symbol error in the product code 1500 in the symbol data memory 1822, to a value estimated to be a correct value. In this description, the rewriting process is also referred to as "error correction process". When the control unit 1630 partially rewrites the product code 1500 in the symbol data memory 1822 by the rewriting process, the control unit 1630 registers the information indicating how and which symbol in the product code 1500 in the symbol data memory 1822 has been rewritten (rewriting log information) in the correction symbol list 1821. The rewriting log information (recurrence information) includes information for specifying the position of the symbol determined as an error in the product code 1500 in the symbol data memory 1822 (hereinafter, also "in-product-code error symbol position information"), and information indicating from which value to which value the value of the symbol has been rewritten (hereinafter, also "before-and-after update value information").

As the in-product-code error symbol position information, various pieces of information, for example, information indicating the position in the product code of the component code where the symbol is present and the position of the symbol in the component code word of the component code (for example, the order in a symbol array) can be used. The before-and-after update value information includes information specifying, for example, at least one of a symbol value before rewriting and a symbol value after rewriting.

The component code data buffer 1841 arranged in the component code decoder 1640 is a memory that reads component code data (that is, the component code word) to be decoded individually from the symbol data memory 1822 in the decoded data memory 1620, and buffers the component code data.

The bounded distance decoder 1842 is connected to the component code data buffer 1841, for example, in the component code decoder 1640, and performs bounded distance decoding on the component code word read by the component code data buffer 1841, to detect information relating to the position of the error symbol present in the component code word (hereinafter, also "in-component-code error symbol position information"). As the in-component-code error symbol position information, various pieces of information such as information indicating, for example, the position of the symbol in the component code word (for example, the order in a symbol array) can be used.

The in-component-code error symbol position information detected by the bounded distance decoder 1842 is transmitted to the control unit 1630. The control unit 1630 generates the in-product-code error symbol position information based on the information specifying the component code to be decoded, which is held in the DRAM 27 or a register (not illustrated), and the received in-component-code error symbol position information. Further, the control unit 1630 rewrites the value of the symbol in the symbol data memory 1822 specified by the generated in-product-code error symbol position information, to a value estimated to be a correct value (rewriting process).

As a method of obtaining the in-product-code error symbol position information from the in-component-code error symbol position information, various methods can be used such as a method of using a mapping table that manages the correspondence relation thereof and a method of calculating the position information from the position of the symbol based on a specific symbol. When the symbol value is either "0" or "1" as in this description, the value estimated to be a correct value can be a value other than the current value. Therefore, when the current value determined to be an error is "0", the value of the symbol is rewritten to "1", and when the current value determined to be an error is "1", the value of the symbol is rewritten to "0".

Further, the control unit 1630 registers in the correction symbol list 1821 the rewriting log information (recurrence information) including the in-product-code error symbol position information and the before-and-after update value information indicating from which value to which value the value of the symbol specified by the in-product-code error symbol position information has been rewritten.

Figure 24:
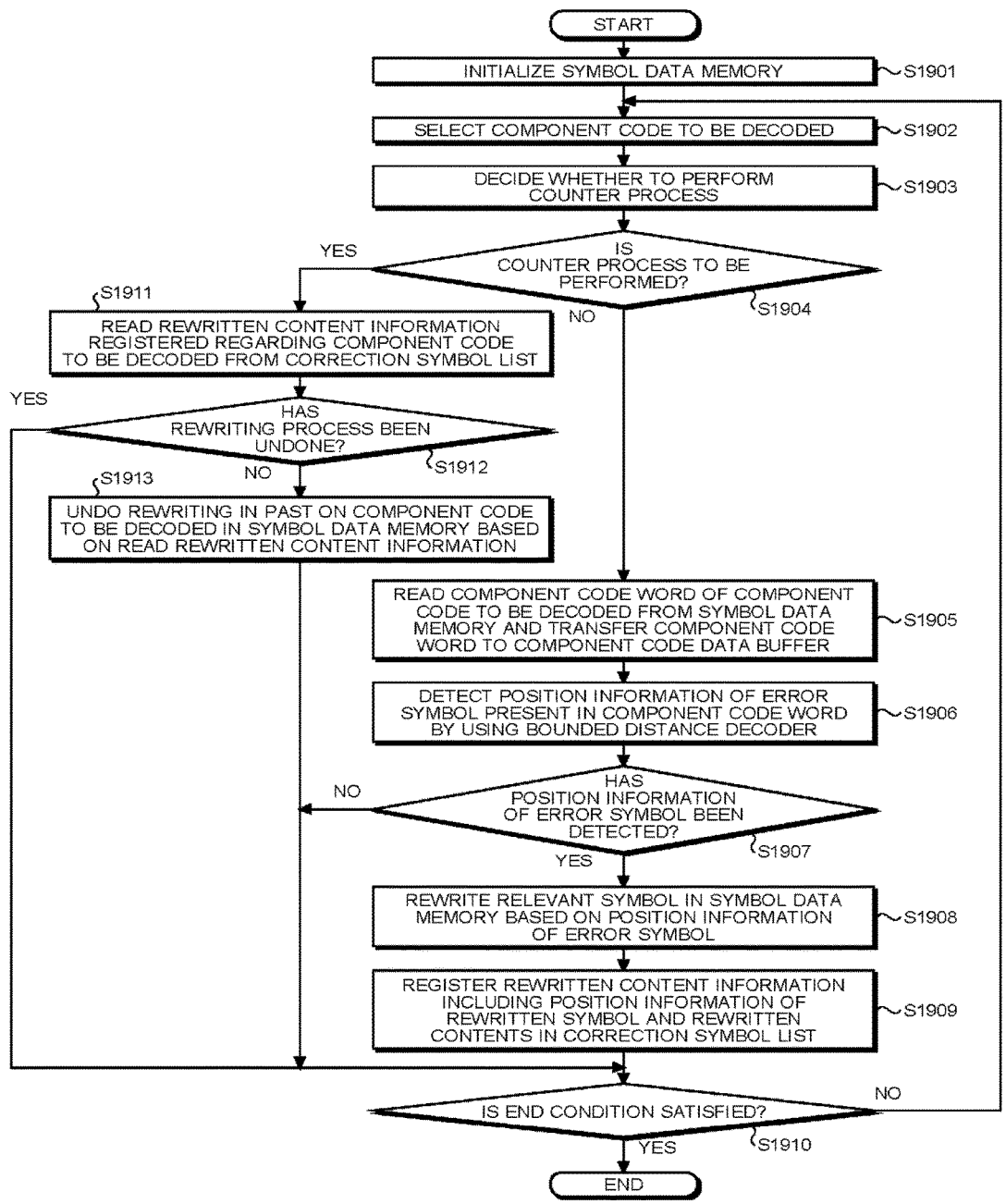
FIG. 24 is a flowchart illustrating an example of an iterated decoding process according to the fourth embodiment.

The iterated decoding process according to this embodiment will be described next in detail with reference to FIG. 24. FIG. 24 is a flowchart illustrating an example of the iterated decoding process according to this embodiment. It is assumed that before the process flow illustrated in FIG. 24, the product code 1500 (see FIG. 20) read from the nonvolatile memory 3 has been stored in the symbol data memory 1822 of the decoded data memory 1620. In FIG. 24, the process flow is described, focusing on the operation of the control unit 1630.

As illustrated in FIG. 24, the control unit 1630 deletes the data in the symbol data memory 1822 and reads the product code 1500 from the nonvolatile memory 3, and stores the read product code 1500 in the symbol data memory 1822 (initialization of the symbol data memory) (Step S1901).

The control unit 1630 selects a component code to be decoded from the component codes 1511 to 1515 and 1521 to 1525 forming the product code 1500 (Step S1902). At this time, the control unit 1630 can repeatedly perform selecting the component codes 1511 to 1515 in the order from the component code 1511 being a top in the row direction sequentially along the column direction, for example, among the component codes 1511 to 1515 and 1521 to 1525 forming the product code 1500, and thereafter, selecting the component codes 1521 to 1525 in the order from the component code 1521 being a top in the column direction sequentially along the row direction, as described in Step S1701 in FIG. 22. However, the selection order of the component code to be decoded is not limited thereto. The selection order can be variously modified to be, such as a selection order in which a component code in the row direction and a component code in the column direction are alternately selected one by one, or a selection order in which a component code is selected at random by using a pseudo random number or the like.

The control unit 1630 decides whether to perform the counter process on the component code selected as a decoding target in Step S1902 (Step S1903). The operation to decide whether to perform the counter process will be described later in detail with reference to FIG. 25.

In the decision in Step S1903, when it is decided not to perform the counter process (NO in Step S1904), the control unit 1630 reads the data of the component code (component code word) selected in Step S1902 from the symbol data memory 1822, and transfers the read component code word to the component code data buffer 1841 (Step S1905).

The control unit 1630 performs the bounded distance decoding on the component code word transferred to the component code data buffer 1841 by using the bounded distance decoder 1842, to detect the position information of an error symbol present in the component code word (in-component-code error symbol position information) (Step S1906).

The control unit 1630 determines whether the position information of the error symbol (the in-component-code error symbol position information) has been detected in the bounded distance decoding in Step S1906 (Step S1907). When the in-component-code error symbol position information has not been detected (NO in Step S1907), the control unit 1630 proceeds to Step S1910. On the other hand, when the in-component-code error symbol position information has been detected (YES in Step S1907), the control unit 1630 proceeds to Step S1908 to perform a rewriting process of rewriting the value of the symbol in the symbol data memory 1822 based on the detected in-component-code error symbol position information.

In the rewriting process in Step S1908, first, the control unit 1630 obtains the in-product-code error symbol position information based on the detected in-component-code error symbol position information. As the method of obtaining the in-product-code error symbol position information from the in-component-code error symbol position information, as described above, various methods can be used such as the method of using a mapping table that manages the correspondence relation thereof and the method of calculating the position information from the position of the symbol based on a specific symbol. The control unit 1630 then performs the rewriting process (error correction process) of rewriting the value of the symbol in the symbol data memory 1822 specified by the in-product-code error symbol position information to a value estimated to be a correct value based on the obtained in-product-code error symbol position information. For example, when "0" is recorded in the top symbol (data symbol $d_0$) in the component code word of the component code 1511 in the top row in the product code 1500 in the symbol data memory 1822, and when it is determined that the top symbol (data symbol $d_0$) is an error symbol, the control unit 1630 rewrites the top symbol (data symbol $d_0$) from "0" to "1".

When the rewriting process is performed in this manner, the control unit 1630 registers the information (rewriting log information) indicating how and which symbol in the product code 1500 in the symbol data memory 1822 has been rewritten by the rewriting process in Step S1908, in the correction symbol list 1821 (Step S1909), and proceeds to Step S1910. For example, as in the above-described example, when the top symbol (data symbol $d_0$) in the component code word of the component code 1511 in the top row in the product code 1500 in the symbol data memory 1822 is rewritten from "0" to "1", the control unit 1630 registers the in-product-code error symbol position information for specifying the top symbol (data symbol $d_0$) in the component code word of the component code 1511 in the top row in the product code 1500 in the symbol data memory 1822, and the before-and-after update value information indicating that the top symbol (data symbol $d_0$) has been rewritten from "0" to "1", in the correction symbol list 1821 as the rewriting log information (recurrence information).

In Step S1910, the control unit 1630 determines whether the end condition of the iterated decoding process on the product code 1500 loaded to the symbol data memory 1822 is satisfied. When the end condition is satisfied (YES in Step S1910), the control unit 1630 finishes the operation. On the other hand, when the end condition is not satisfied (NO in Step S1910), the control unit 1630 returns to Step S1902, to select the next component code and perform the operation thereafter. The end condition (terminating condition) can be such that a sufficiently appropriate decoded word can be acquired and the number of repetition of the iterated decoding has reached a predetermined number of times.

When it is decided to perform the counter process in the decision in Step S1903 (YES in Step S1904), the control unit 1630 reads the rewriting log information registered in the correction symbol list 1821 regarding the component code to be decoded in Step S1902 (Step S1911), and confirms the read rewriting log information, to determine whether the past rewriting process on the component code to be decoded has been already undone (Step S1912). When the past rewriting process has been already undone (YES in Step S1912), the control unit 1630 proceeds to Step S1910 without performing the counter process on the component code. On the other hand, when the past rewriting process has not been undone (NO in Step S1912), the control unit 1630 performs the counter process (also referred to as "re-rewriting process") to undo the writing process performed in the past on the component code in the symbol data memory 1822 based on the read rewriting log information (Step S1913), and the control unit 1630 proceeds to Step S1910.

The counter process (re-rewriting process) in Step S1913 will be described in more detail. For example, in the example described above, the control unit 1630 first reads from the correction symbol list 1821 the rewriting log information indicating that the top symbol (data symbol do) in the component code word of the component code 1511 in the top row in the product code 1500 in the symbol data memory 1822 has been rewritten from "0" to "1" Subsequently, by rewriting the top symbol (data symbol $d_0$) from "1" to "0" again, the control unit 1630 performs the counter process (re-rewriting process) of undoing the rewriting process performed in the past. Thus, in the counter process (re-rewriting process) according to this embodiment, an inverse process to the rewriting process performed in the past on the component code to be decoded is performed.

Figure 25:
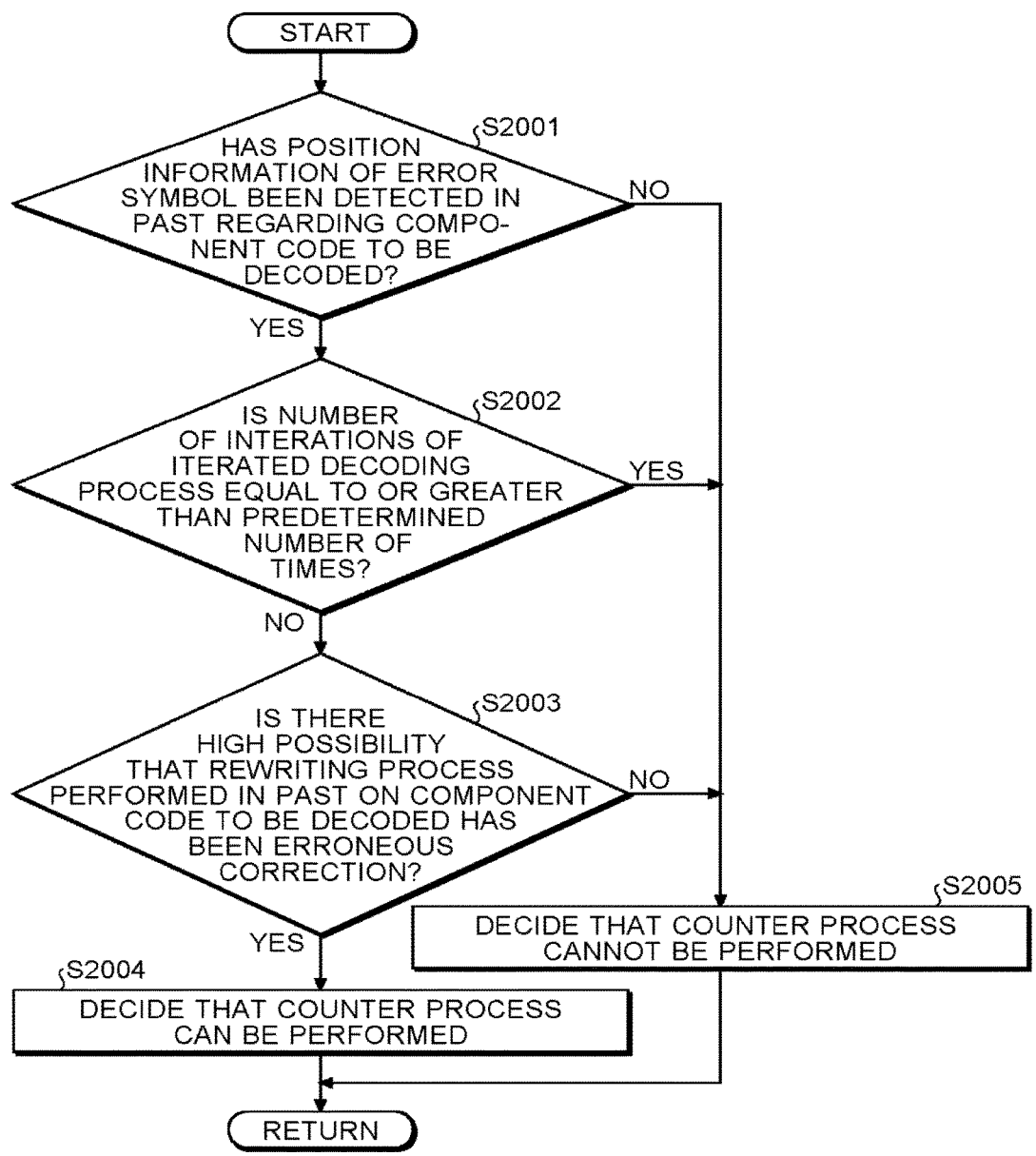
FIG. 25 is a flowchart illustrating an example of an operation to decide whether to perform a counter process according to the fourth embodiment.

Subsequently, decision whether to perform the counter process performed in Step S1903 in FIG. 24 will be described in detail with reference to FIG. 25. FIG. 25 is a flowchart illustrating an example of an operation to decide whether to perform the counter process according to this embodiment.

As illustrated in FIG. 25, the control unit 1630 first determines whether the position information of the error symbol (in-component-code error symbol position information) has been detected in the past regarding the component code to be decoded (Step S2001). The determination whether the position information of the error symbol has been detected in the past can be performed, for example, by confirming whether the rewriting log information has been registered in the correction symbol list 1821 regarding the component code to be decoded. When the position information of the error symbol has not been detected in the past regarding the component code to be detected (NO in Step S2001), there is no target to be returned. Therefore, the control unit 1630 decides that the counter process can be performed (Step S2005), and returns to the operation illustrated in FIG. 24.

On the other hand, when the position information of the error symbol (in-component-code error symbol position information) has been detected in the past regarding the component code to be decoded (YES in Step S2001), the control unit 1630 checks a counter (not illustrated) that counts the number of iterations of the iterated decoding process by the bounded distance decoder 1842, to determine whether the counter value is equal to or greater than the predetermined number of times set beforehand (Step S2002). The counter process in this embodiment is for increasing the probability of decoding success by undoing the error correction that may be erroneous correction. However, in the counter process, there is a possibility that error correction in which the error symbol has been corrected to a correct value may be undone. Therefore, in this embodiment, it is configured such that after the iterated decoding process has been performed a certain number of times, the counter process is not performed (NO in Step S2002 to Step S2005). Accordingly, both the decoding success probability and the throughput can be improved. A threshold of the number of iterations of the iterated decoding process to be used at the time of deciding whether to perform the counter process can be appropriately set in accordance with the code to be used, the decoding algorithm, or the like.

When the counter value is equal to or greater than the predetermined number of times (threshold), that is, when the number of iterations of the iterated decoding process is equal to or greater than the predetermined number of times (YES in Step S2002), the control unit 1630 proceeds to Step S2005 to decide that the counter process can be performed, and returns to the operation illustrated in FIG. 24. On the other hand, when the counter value is less than the predetermined number of times, that is, when the number of iterations of the iterated decoding process is less than the predetermined number of times (NO in Step S2002), the control unit 1630 proceeds to Step S2003.

In Step S2003, the control unit 1630 determines whether the possibility that the rewriting process performed in the past on the component code to be decoded has been erroneous correction is high. When it is determined that the possibility that the rewriting process performed in the past on the component code to be decoded has been erroneous correction is not high (NO in Step S2003), the control unit 1630 decides that the counter process cannot be performed (Step S2005), and returns to the operation illustrated in FIG. 24. On the other hand, when it is determined that the possibility that the rewriting process performed in the past on the component code to be decoded has been erroneous correction is high (YES in Step S2003), the control unit 1630 decides that the counter process can be performed (Step S2004), and returns to the operation illustrated in FIG. 24.

For the decision whether the possibility that the rewriting process performed in the past in Step S2003 has been erroneous correction is high, some decision criteria as described below can be used.

As one of the decision criteria, "the number of symbols rewritten in the past rewriting process" included in the component code to be decoded, in other words, "the number of symbols determined to be an error in the bounded distance decoding performed in the component code to be decoded can be exemplified. This is set as a first decision criterion in the description. The reason why such a first decision criterion can be used is that in general, when there is a large number of symbols rewritten in the rewriting process, there is such a tendency that there is a high probability of the rewriting process on these symbols being erroneous correction. Therefore, when the number of symbols rewritten in the past rewriting process is greater than the predetermined number (for example, two) set beforehand, Step S2003 can be configured such that the control unit 1630 decides that "there is a high possibility that the rewriting process performed in the past on the component code to be decoded has been erroneous correction". When the symbol forming the component code to be decoded is the element of the Galois field, the element of the Galois field can be also handled as the element in which a plurality of elements (for example, bits) of a prime field gather together. Therefore, when the symbol is the element of the Galois field, "the number of rewritten elements of the prime field in the symbol rewritten in the past rewriting process" can be used instead of "the number of symbols rewritten in the past rewriting process".

As another one of decision criteria, "the number of symbols that has been determined as an error in a certain dimension, with the syndrome value of the component code in the other dimension including the symbol being not "0"" can be exemplified. This is set as a second decision criterion in the description. The other dimension means that the dimension is different from the dimension of the component code selected in Step S1902. The reason why such a second decision criterion can be used is that, even if it is determined that the syndrome value of the component code is "0", that is, there is no error as a result of performing error correction (rewriting) on the component code in one dimension, if it is determined that the syndrome value of the component code in the other dimension including the symbol rewritten by the error correction (rewriting) is not "0", that is, there is an error, there is a high possibility that the error correction (rewriting) has been erroneous correction.

The second decision criterion will be described by citing the specific example described above. In the specific example described above, it is assumed a case in which the component code 1511 in the top row in the product code 1500 is a decoding target, and because an error has been found in the top symbol (data symbol $d_0$) "0" of the component code 1511, a symbol corresponding to the top symbol (data symbol $d_0$) has been rewritten from "0" to "1" in the symbol data memory 1822, and the rewriting log (rewriting log information) is registered in the correction symbol list 1821. When taking the code structure of the product code 1500 into consideration, the top symbol (data symbol $d_0$) in the component code 1511 in the top row is also a top symbol (data symbol $d_0$) in the component code 1521 in the top column. That is, the top symbol (data symbol $d_0$) in the component code 1511 in the top row is also encoded by the component code 1521 in the top column. Therefore, when the component code selected as a decoding target in Step S1902 in FIG. 24 is the component code 1511 in the top row, and the rewriting log information read in Step S2001 in FIG. 25 includes information indicating that the top symbol (data symbol $d_0$) in the component code 1511 in the top row has been rewritten, in Step S2003 in FIG. 25, the control unit 1630 reads the component code 1521 in the top column from the symbol data memory 1822 and calculates the syndrome value thereof, to determine whether the calculated syndrome value is "0". That the calculated syndrome value is not "0" means that one or more error symbols need to be included in the component code 1521 in the top column. Therefore, in Step S2003, the control unit 1630 can decide that "there is relatively a high possibility that the rewriting process to rewrite the top symbol in the component code 1511 in the top row of the product code 1500 stored in the symbol data memory 1822 from "0" to "1" performed on the component code 1511 in the top row in the past has been erroneous correction".

As for the first and second decision criteria described above, either one can be used or both can be used in the decision in Step S2003 in FIG. 25. Further, the decision criteria are not limited to those two, and the respective criteria can be used singly or in combination, including other decision criteria. For example, when both the first and second decision criteria are adopted, Step S2003 can be configured such that the control unit 1630 decides that the counter process can be performed, when "the number of symbols determined as an error in the bounded distance decoding performed in the past" included in the component code to be decoded is greater than the predetermined number (for example, two) set beforehand, and "the number of symbols that has been determined as an error in a certain dimension, with the syndrome value of the component code in the other dimension including the symbol being not "0"" included in the same component code is equal to or greater than the predetermined number (for example, one) set beforehand.

As described above, according to this embodiment, an erroneously corrected component code or a component code failed in calculation is rolled back (returned) to a component code in a state before erroneous correction or failed calculation is performed, to continue the decoding process thereafter. Therefore, the probability of decoding success can be further increased.

According to this embodiment, the memory area that stores therein the multi-dimensional error correction code in the state before the erroneous correction or the failed calculation is performed (corresponding to the received word storage area 311 or the pre-update code word storage area 311A) is not required other than the memory area that stores therein the multi-dimensional error correction code while being decoded (corresponding to the updated code word storage area 312 or the after-update code word storage area 312A). Therefore, the decoding success probability by the rollback control (counter process) can be improved while decreasing the required memory area.

Because other configurations, operations and effects are identical to those of the above embodiments, detailed descriptions thereof will not be repeated.

Fifth Embodiment

Another embodiment that can decrease the required memory area while using the concept of rolling back (returning) an erroneously corrected component code and a component code failed in calculation to a component code before the calculation is performed will be described below as a fifth embodiment as an example. In the description below, the same elements as those in the above embodiments will be referenced by the same reference numerals and description thereof will not be repeated.

Figure 26:
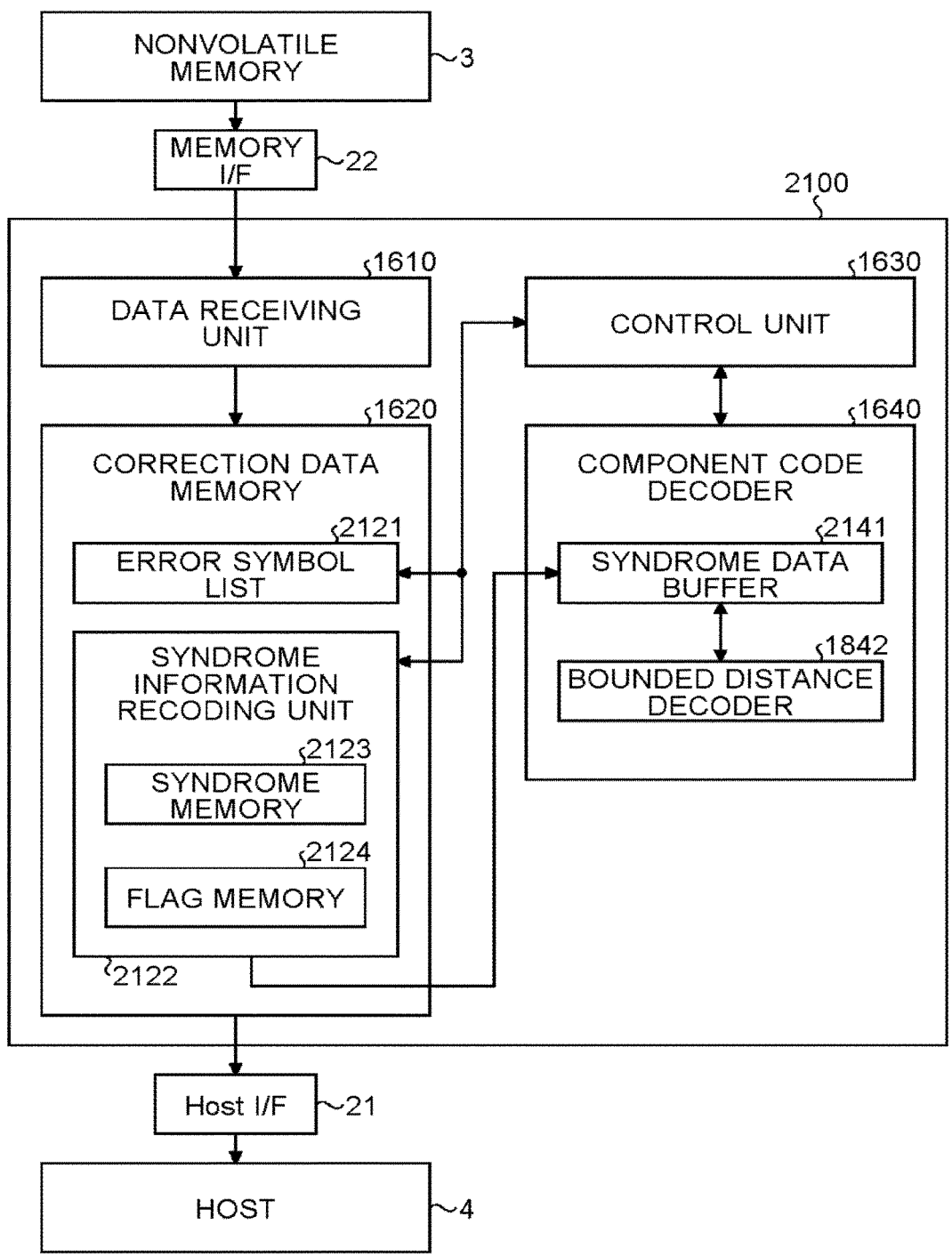
FIG. 26 is a block diagram illustrating a schematic configuration example of a decoder according to a fifth embodiment.

FIG. 26 is a block diagram illustrating a schematic configuration example of a decoder according to this embodiment. A decoder 2100 illustrated in FIG. 26 can be a decoder functionally realized in the respective units of the memory controller 2, for example, illustrated in FIG. 1, as in the decoder 1600 illustrated in FIG. 21. In the description below, for simplifying the description, a case in which the product code 1500 is adopted as the multi-dimensional error correction code, in which the BCH code is used for the component code including binary bit information of "0" and "1" is illustrated.

As illustrated in FIG. 26, the decoder 2100 has the same configuration as, for example, the decoder 1600 illustrated in FIG. 21. However, in the decoder 2100, an error symbol list (intermediate decoded word memory) 2121 and a syndrome information recording unit (recurrence information holding unit) 2122 are arranged in the decoded data memory 1620, and a syndrome data buffer 2141 and the bounded distance decoder 1842 are provided in the component code decoder 1640.

The error symbol list 2121 in the decoded data memory 1620 is a memory that holds the data while being decoded, that is, the intermediate decoded word. The error symbol list 2121 lists and records the positions of the error symbols detected by the component code decoder 1640. That is, the intermediate decoded word in this embodiment is information relating to the listed positions of the error symbols. The position of the error symbol is a position of the error symbol in the multi-dimensional error correction code (the product code 1500). Therefore, the in-product-code error symbol position information described above can be listed and held in the error symbol list 2121, so that the position of the error symbol in the multi-dimensional error correction code (in the case of the product code, the position in the product code) can be specified. At this time, the error symbol list 2121 can hold the list of the error symbol positions (for example, a list of the in-product-code error symbol position information) in a linked list format.

The syndrome information recoding unit 2122 is a memory that records information required for decoding. The information required for decoding in this embodiment may be information relating to a syndrome calculated based on the component code word of the respective component codes, and information relating to the syndrome calculated based on data acquired by reflecting correction of the error symbol position recorded in the error symbol list 2121 on the code word read from the nonvolatile memory 3. The information relating to the syndrome can include, for example, syndrome values of respective component codes and corrected flags indicating whether the respective component codes have been subjected to error correction. Therefore, the syndrome information recoding unit 2122 includes a syndrome memory 2123 and a flag memory 2124.

The syndrome memory 2123 is one of memories (recurrence information holding unit) that holds the recurrence information required for the counter process, in other words, necessary and sufficient for reproducing the information relating to the error symbol detected by the decoding process (bounded distance decoding) on the respective component codes (however, in this embodiment, the syndrome values of the respective component codes), and records syndrome values of the respective component codes. That is, the recurrence information in this embodiment includes the syndrome value of the respective component codes. For example, when the product code 1500 to be decoded has a code structure including ten component codes 1511 to 1515 and 1521 to 1525, the syndrome memory 2123 individually records the syndrome value for each of the ten component codes.

The flag memory 2124 is one of the memories (recurrence information holding unit) that holds the recurrence information required for the counter process, in other words, necessary and sufficient for reproducing the information relating to the error symbol detected by the decoding process (bounded distance decoding) on the respective component codes (syndrome values of the respective component codes), and records the corrected flags indicating whether the respective component codes have been subjected to error correction. That is, the recurrence information in this embodiment includes the corrected flags indicating whether the respective component codes have been subjected to error correction. The flag memory 2124 holds the corrected flag corresponding one-to-one with the individual component code. The corrected flag may be a binary flag indicating that, for example, error correction has been performed (hereinafter, "corrected") by "1", and error correction has not been performed (hereinafter, "uncorrected") by "0". The corrected flag is for deciding whether the respective component codes have been subjected to error correction, and can be replaced by various configurations that can exert the same functions as those of the corrected flag. That is, the corrected flag can be replaced by various configurations, so long as the configuration enables decision whether the respective component codes have been subjected to error correction.

The syndrome data buffer 2141 in the component code decoder 1640 is a memory that reads the syndrome value of the component code to be decoded from the syndrome information recording unit 2122 and buffers the syndrome value.

The bounded distance decoder 1842 is connected to the syndrome data buffer 2141, for example, in the component code decoder 1640, and detects the position information of the error symbol corresponding to the syndrome value read by the syndrome data buffer 2141 (in-component-code error symbol position information) by performing the bounded distance decoding by inputting the syndrome value.

Figure 27:
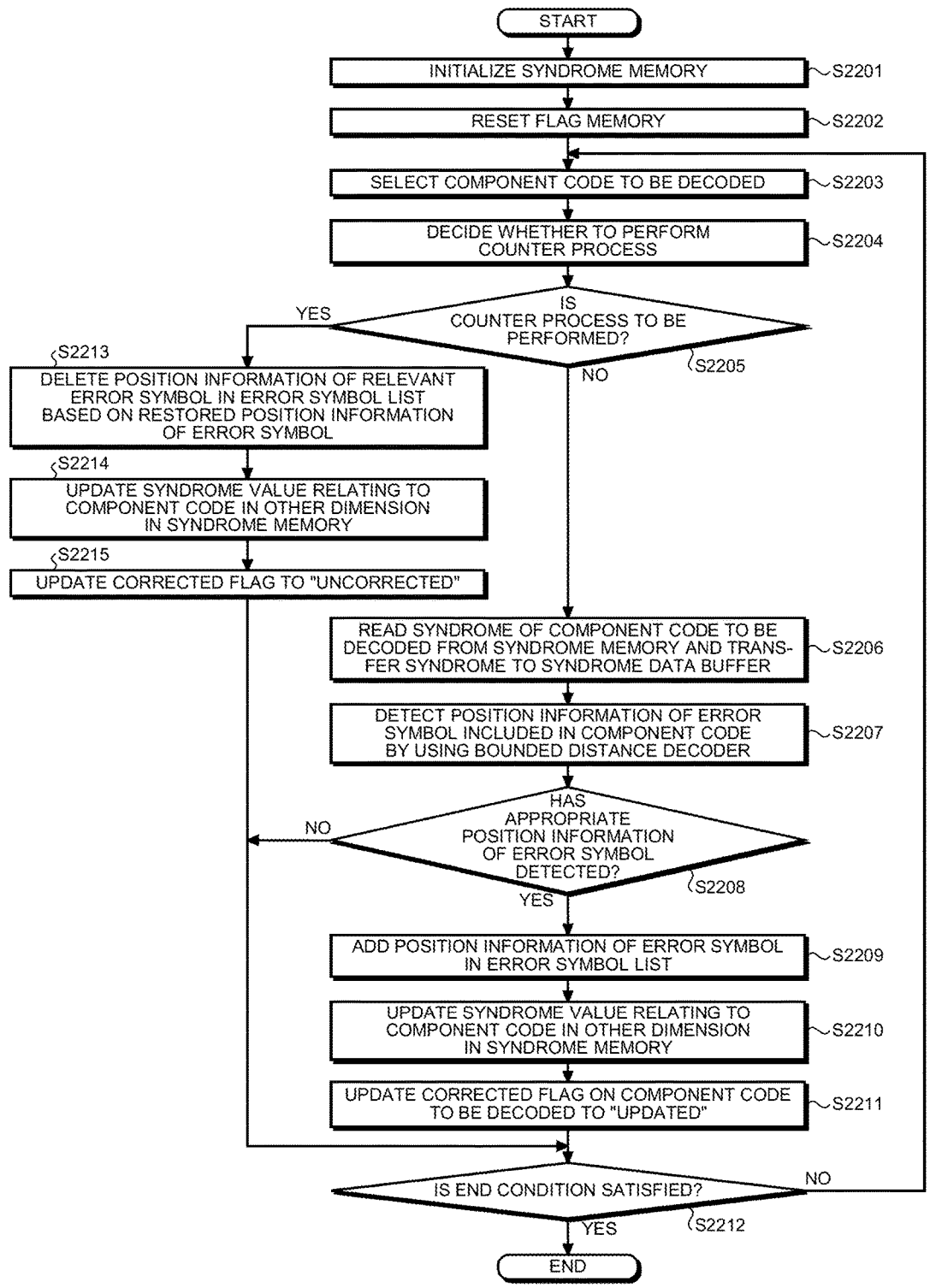
FIG. 27 is a flowchart illustrating an example of an iterated decoding process according to the fifth embodiment.

The iterated decoding process according to this embodiment will be described next in detail with reference to FIG. 27. FIG. 27 is a flowchart illustrating an example of the iterated decoding process according to this embodiment. In FIG. 27, the process flow is described, focusing on the operation of the control unit 1630.

As illustrated in FIG. 27, the control unit 1630 first deletes the data in the syndrome memory 2123, reads the product code 1500 from the nonvolatile memory 3, and calculates the syndrome values of the respective component codes forming the read product code 1500, to store the calculated syndrome values of the respective component codes in the syndrome memory 2123 (initialization of the syndrome memory) (Step S2201). The control unit 1630 then resets the flag memory 2124 so that the corrected flags on all the component codes indicate "uncorrected" (reset of the flag memory) (Step S2202).

Subsequently, the control unit 1630 selects the component code to be decoded from the component codes forming the product code 1500 as in Steps S1902 to S1903 in FIG. 24 (Step S2203), to decide whether the counter process on the selected component code can be performed (Step S2204). However, the operation to decide whether the counter process can be performed in this embodiment is an operation illustrated in FIG. 28 described later.

When it is decided not to perform the counter process in the decision in Step S2204 (NO in Step S2205), the control unit 1630 reads the syndrome value of the component code selected in Step S2203 from the syndrome memory 2123, and transfers the read syndrome value to the syndrome data buffer 2141 (Step S2206).

The control unit 1630 performs the bounded distance decoding based on the syndrome value on the syndrome value transferred to the syndrome data buffer 2141 by using the bounded distance decoder 1842, to detect the position information of the error symbol present in the selected component code (the in-component-code error symbol position information) (Step S2207).

The control unit 1630 then determines whether the appropriate in-component-code error symbol position information has been detected by the bounded distance decoding in Step S2207 (Step S2208). The determination whether the detected in-component-code error symbol position information is appropriate can be performed, for example, in the following manner.

That is, in the determination whether the detected in-component-code error symbol position information is appropriate, it is decided first whether the in-component-code error symbol position information has been detected by the bounded distance decoding. When it is decided that the in-component-code error symbol position information has not been detected, in Step S2208, the control unit 1630 determines that the appropriate in-component-code error symbol position information has not been detected (NO in Step S2208), and the control unit 1630 proceeds to Step S2212. On the other hand, when it is decided that the in-component-code error symbol position information has been detected, the control unit 1630 confirms the corrected flag regarding the component codes in the other dimension including the symbol specified by the detected in-component-code error symbol position information referring to the flag memory 2124. The other dimension means a dimension other than the dimension of the component code selected in Step S2203.

When the component code in the other dimension including a symbol determined as an error in the bounded distance decoding on the component code in one dimension has been corrected in the past, there is a high possibility that the in-component-code error symbol position information detected by the bounded distance decoding this time is not appropriate. Therefore, in Step S2208, when the corrected flag with regard to the component code in the other dimension including the symbol specified by the detected in-component-code error symbol position information indicates "corrected", the control unit 1630 determines that the appropriate in-component-code error symbol position information has not been detected (NO in Step 32208), and proceeds to Step S2212. On the other hand, when the relevant corrected flag indicates "uncorrected", the control unit 1630 determines that the appropriate in-component-code error symbol position information has been detected (YES in Step S2208), and proceeds to Step S2209.

In Step S2209, the control unit 1630 generates the in-product-code error symbol position information based on the information specifying the component code to be decoded, which is held in, for example, the DRAM 27 or a register (not illustrated), and the in-component-code error symbol position information detected in Step S2207, and additionally registers the generated in-product-code error symbol position information in the error symbol list 2121 (Step S2209). In this embodiment, the process of additionally registering the in-product-code error symbol position information in the error symbol list 2121 corresponds to the rewriting process of rewriting a value corresponding to the error symbol in the intermediate decoded word.

The control unit 1630 also updates the syndrome value stored in the syndrome memory 2123 regarding the component code in the other dimension including the symbol specified by the in-component-code error symbol position information detected by the bounded distance decoding in Step S2207 (Step S2210). In the update of the syndrome value, an exclusive OR (EXOR) of a difference between the syndrome value stored in the syndrome memory 2123 regarding the component code in the other dimension and the syndrome value corresponding to the symbol determined as an error in the bounded distance decoding is calculated, and the syndrome value stored in the syndrome memory 2123 regarding the component code in the other dimension is updated by a new syndrome value acquired by the calculation of the EXOR.

A specific example thereof will be described. For example, when the component code to be decoded is the component code 1511 in the top row in the product code 1500, and the symbol determined as an error by the bounded distance decoding is the top symbol (data symbol $d_0$) of the component code 1511, an exclusive OR (EXOR) of a difference between the syndrome value stored in the syndrome memory 2123 regarding the component code 1521 in the other dimension (that is, in the column direction) including the top symbol (data symbol $d_0$) and the syndrome value corresponding to the top symbol (data symbol $d_0$) of the component code 1511 is calculated, and the syndrome value stored in the syndrome memory 2123 regarding the component code 1521 in the top column is updated by the new syndrome value acquired by the calculation.

Thereafter, the control unit 1630 updates the corrected flag regarding the component code to be decoded in the flag memory 2124 to "corrected" (Step S2211), and proceeds to Step S2212.

In Step S2210 in FIG. 27, the syndrome value stored in the syndrome memory 2123 regarding the component code in the other dimension including the symbol specified by the in-component-code error symbol position information detected by the bounded distance decoding (Step S2207) is updated. However, the syndrome value of the component code, which is an actual bounded distance decoding target in Step S2207, is not updated and remains in the syndrome memory 2123. Thus, the reason for leaving the syndrome value of the component code, which is an actual bounded distance decoding target, without being updated is to enable an inverse operation based on the syndrome value regarding which symbol has been rewritten at the time of the counter process. By enabling the inverse operation, in this embodiment, the memory area that records the contents of the past rewriting process on the product code 1500, such as the corrected symbol list 1821 in the fourth embodiment, is not required. Therefore, the required memory area can be further decreased.

The syndrome value remaining in the syndrome memory 2123 without being updated with regard to the component code with the corrected flag indicating "corrected" is not rewritten by the decoding process on the component code in the other dimension. This is because further correction is not performed on the corrected component code, as a result of the detection process of appropriate in-component-code error symbol position information described above (Step S2208, see FIG. 27) and an operation to decide whether to perform the counter process (S2204, see FIG. 28), which will be described below in detail.

In Step S2212, the control unit 1630 determines whether the end condition of the iterated decoding process on the product code 1500 is satisfied. When the end condition is satisfied (YES in Step S2212), the control unit 1630 finishes the operation. On the other hand, when the end condition is not satisfied (NO in Step S2212), the control unit 1630 returns to Step S2203 to select the next component code and perform the operation thereafter. The end condition (terminating condition) can be such that a sufficiently appropriate decoded word can be acquired or the number of iterations of the iterated decoding has reached a predetermined number of times.

When it is decided to perform the counter process in the decision in Step S2205 (YES in Step S2205), the control unit 1630 performs the counter process (re-rewriting process) to undo the rewriting process performed by performing the operation in Steps S2209 to S2211 on the relevant component code in the past (Steps S2213 to S2215), and proceeds to Step S2212. For the sake of convenience of explanation, details of the counter process (re-rewriting process) performed in Steps S2213 to S2215 will be described after description of the operation to decide whether to perform the counter process illustrated in FIG. 28.

Figure 28:
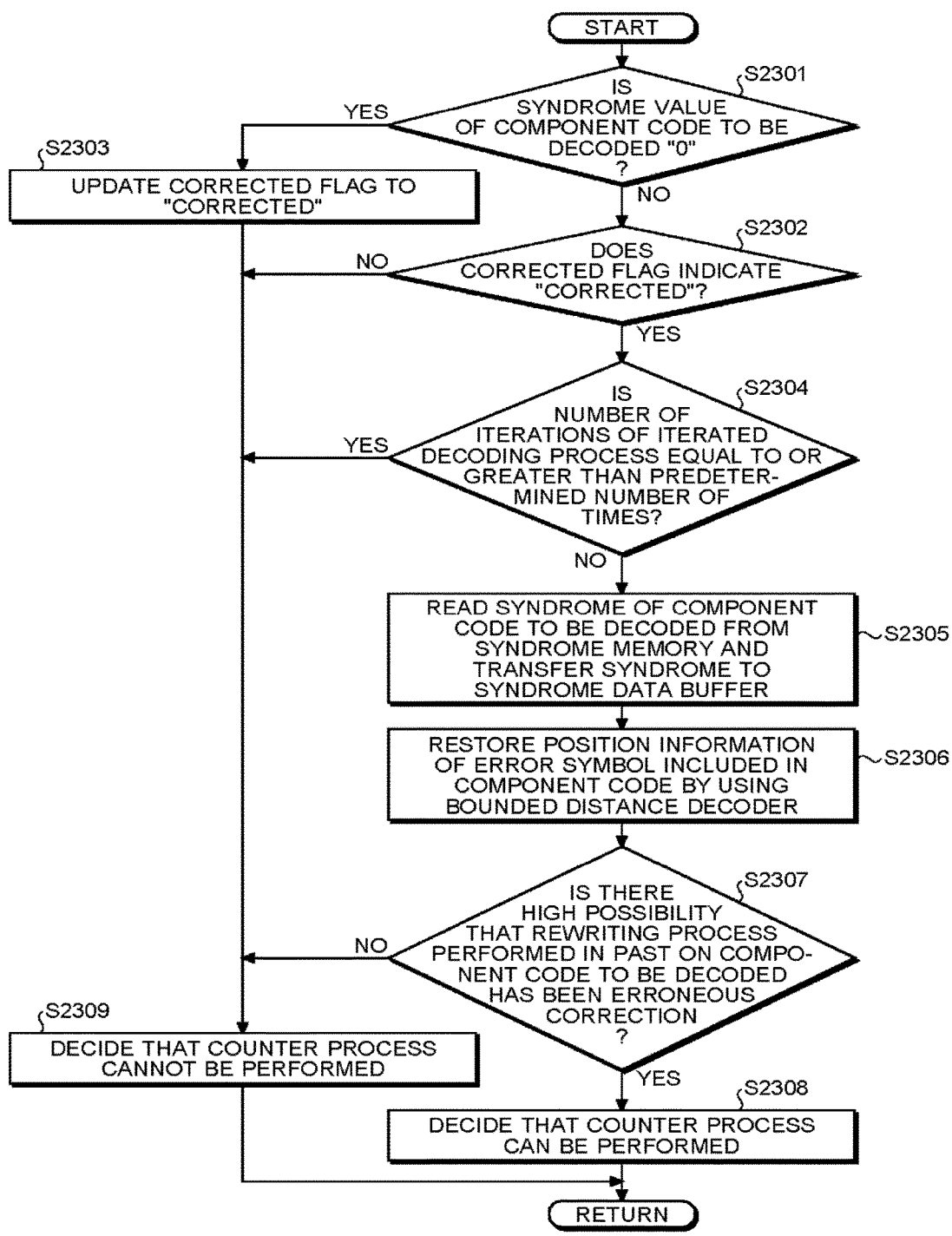
FIG. 28 is a flowchart illustrating an example of an operation to decide whether to perform a counter process according to the fifth embodiment.

The operation to decide whether to perform the counter process, performed in Step S2204 in FIG. 27 will be described in detail with reference to FIG. 28. FIG. 28 is a flowchart illustrating an example of the operation to decide whether to perform the counter process according to this embodiment.

As illustrated in FIG. 28, the control unit 1630 first determines whether the syndrome value recorded regarding the component code to be decoded set in Step S2203 in FIG. 27 is "0" by referring to the syndrome memory 2123 (Step S2301). When the recorded syndrome value is "0" (YES in Step S2301), after the relevant corrected flag in the flag memory 2124 is updated to "corrected" (Step S2303), the control unit 1630 decides that the counter process cannot be performed (Step S2309), and returns to the operation illustrated in FIG. 27. On the other hand, when the recorded syndrome value of the component code to be decoded is not "0" (NO in Step S2301), the control unit 1630 proceeds to Step S2302.

In Step S2302, the control unit 1630 determines whether the corrected flag regarding the component code to be decoded indicates "corrected" by referring to the flag memory 2124, and when the corrected flag indicates "corrected" (YES in Step S2302), the control unit 1630 proceeds to Step S2304. On the other hand, when the corrected flag regarding the component code to be decoded indicates "uncorrected" (NO in Step S2302), the control unit 1630 decides that the counter process cannot be performed (Step S2309), and returns to the operation illustrated in FIG. 27.

In Step S2304, the control unit 1630 checks a counter (not illustrated) that counts the number of iterations of the iterated decoding process by the bounded distance decoder 1842, for example, as in Step S2002 in FIG. 25, to determine whether the counter value is equal to or greater than a predetermined number of times set beforehand (Step S2304). When the counter value is equal to or greater than the predetermined number of times (threshold), that is, the number of iterations of the iterated decoding process is equal to or greater than the predetermined number of times (YES in Step S2304), the control unit 1630 proceeds to Step S2309 to decide the counter process cannot be performed, and returns to the operation illustrated in FIG. 27. On the other hand, when the counter value is less than the predetermined number of times, that is, the number of iterations of the iterated decoding process is less than the predetermined number of times (NO in Step S2304), the control unit 1630 proceeds to Steps S2305 to S2306.

The operations in Steps S2305 to S2306 may be substantially the same as the operations in Steps S2206 to S2207 in FIG. 27. Therefore, the control unit 1630 first reads the syndrome value of the component code selected in Step S2203 in FIG. 27 from the syndrome memory 2123, and transfers the read syndrome value to the syndrome data buffer 2141 (Step S2305). Subsequently, the control unit 1630 performs the bounded distance decoding based on the syndrome value on the syndrome value transferred to the syndrome data buffer 2141 by using the bounded distance decoder 1842, to restore the position information of the error symbol present in the selected component code (the in-component-code error symbol position information) (Step S2306).

The position information of the error symbol restored by the operation in Step S2306 (the in-component-code error symbol position information) is the same as the position information (the in-component-code error symbol position information) of the error symbol detected by performing the bounded distance decoding on the same component code in the past. This is because when there is no change in the syndrome value recorded in the syndrome memory 2123 regarding the relevant component code, the position information of the error symbol (the in-component-code error symbol position information) detected from the same syndrome value is the same, and when it is decided the counter process can be performed, the syndrome value recorded in the syndrome memory 2123 regarding the relevant component code is not changed at all times.

As described above, when the position information of the error symbol present in the component code to be decoded (the in-component-code error symbol position information) is restored, the control unit 1630 determines whether the possibility that the restored position information of the error symbol (the in-component-code error symbol position information) has been erroneous correction is high (Step S2307).

For the decision of whether the possibility that the rewriting process performed in the past is erroneous correction in Step S2307 is high, the same decision criteria as those exemplified in the fourth embodiment can be used. That is, it can be configured such that when "the number of symbols rewritten in the past rewriting process" included in the component code to be decoded is greater than the predetermined number set beforehand (the first decision criterion), and "the number of symbols that has been determined as an error in a certain dimension, with the syndrome value of the component code in the other dimension including the symbol being not "0"" is greater than the predetermined number set beforehand, the control unit 1630 decides that the counter process can be performed.

However, in this embodiment, the configuration corresponding to the symbol data memory 1822 in the fourth embodiment is not provided. Therefore, in this embodiment, it is configured such that the control unit 1630 decides the second decision criterion, that is, "the number of symbols that has been determined as an error in a certain dimension, with the syndrome value of the component code in the other dimension including the symbol being not "0"" by using the corrected flag recorded in the flag memory 2124. When the product code 1500 illustrated in FIG. 20 is described as an example, for example, it is assumed that the component code to be decoded is the component code 1511 in the top row, and the restored position information of the error symbol (the in-component-code error symbol position information) indicates the top symbol (the data symbol $d_0$) in the component code 1511. Then, the component code in the other dimension that protects the top symbol (the data symbol $d_0$) is the component code 1521 in the top column. Therefore, the control unit 1630 confirms whether the corrected flag for the component code 1521 in the flag memory 2124 indicates "corrected" or "uncorrected". When the corrected flag indicates "corrected", the control unit 1630 decides that the component code 1511 in the top row has been subjected to error correction, that is, the syndrome value is "0". When the corrected flag indicates "uncorrected", the control unit 1630 decides that the syndrome value of the component code 1511 in the top row is not "0".

When it is determined that the possibility of the rewriting process performed in the past being erroneous correction is not high (NO in Step S2307), the control unit 1630 proceeds to Step S2309 to decide that the counter process cannot be performed, and returns to the operation illustrated in FIG. 27. On the other hand, when it is determined that the possibility of the rewriting process performed in the past being erroneous correction is high (YES in Step S2307), the control unit 1630 proceeds to Step S2308 to decide that the counter process can be performed, and returns to the operation illustrated in FIG. 27.

Subsequently, details of the counter process (re-rewriting process) performed in Steps S2213 to S2215 will be described. In the counter process according to this embodiment, first, the in-product-code error symbol position information indicating a symbol in the component code to be decoded, among the information relating to the position of the error symbol recorded in the error symbol list 2121 (the in-product-code error symbol position information), which is a symbol corresponding to the symbol specified by the in-component-code error symbol position information restored in Step S2306 in FIG. 28, is deleted (Step S2213).

The control unit 1630 then updates the syndrome value stored in the syndrome memory 2123 regarding the component code in the other dimension including the symbol specified by the in-component-code error symbol position information restored in Step S2306 in FIG. 28 (Step S2214). In the update of the syndrome value, as in Step S2210, an exclusive OR (EXOR) of a difference between the syndrome value stored in the syndrome memory 2123 regarding the component code in the other dimension and the syndrome value corresponding to the symbol determined as an error in the bounded distance decoding is calculated, and the syndrome value stored in the syndrome memory 2123 regarding the component code in the other dimension is updated by a new syndrome value acquired by the calculation of the EXOR.

Thereafter, the control unit 1630 rewrites the corrected flag regarding the component code to be decoded in the flag memory 2124 to "uncorrected" (Step S2215), and proceeds to Step S2212.

As described above, according to this embodiment, as in the above embodiments, an erroneously corrected component code and a component code failed in calculation are rolled back (returned) to a component code in a state before erroneous correction and failed calculation are performed, to continue the decoding process thereafter. Therefore, the probability of decoding success can be further increased.

Further, according to this embodiment, not only the memory area that stores the multi-dimensional error correction code in the state before erroneous correction and failed calculation are performed (corresponding to the received word storage area 311 or the pre-update code word storage area 311A), but also the memory area that records the contents of the past rewriting process on the product code 1500 (corresponding to the corrected symbol list 1821) are not required. Therefore, the required memory area can be further decreased.

Other configurations, operations, and effects of the present embodiment are identical to those of the embodiments described above, and thus detailed descriptions thereof will not be repeated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a nonvolatile memory in which a multi-dimensional error correction code having two or more component codes is stored, the memory controller comprising:
   a memory interface that reads out the multi-dimensional error correction code;
   a receiving unit configured to acquire a received word of the multi-dimensional error correction code;
   an intermediate decoded word memory that holds an intermediate decoded word of the multi-dimensional error correction code;
   a decoder configured to perform a decoding process and detect information relating to an error symbol;
   a recurrence information holding unit configured to hold recurrence information for reproducing the information relating to the error symbol detected by the decoding process; and
   a control unit configured to
      instruct the decoder to perform a first decoding process of a first component code included in the intermediate decoded word,
      when a first error symbol included in the first component code is detected by the first decoding process, perform a first rewriting process which is rewriting a value corresponding to the first error symbol in the intermediate decoded word, and record first recurrence information for reproducing a value of the first error symbol before rewriting in the recurrence information holding unit,
      instruct the decoder to perform a second decoding process of a second component code included in the intermediate decoded word, of which a dimension is different from that of the first component code,
      determine whether the first rewriting process is an erroneous correction based on a result of the second decoding process, and
      when it is determined that the first rewriting process is an erroneous correction, perform a counter process which is undoing the first rewriting process based on the first recurrence information recorded in the recurrence information holding unit.

2. The memory controller according to claim 1, wherein the error correction code includes a plurality of first component codes and a plurality of second component codes,
   each of the first component codes is generated based on first data including a plurality of pieces of second data,
   each of the second component codes is generated based on third data including a plurality of pieces of the second data each of which is singly selected from each of the plurality of pieces of the first data included in fourth data which includes a plurality of pieces of the first data, and
   second data included in one third data does not overlap with second data included in another third data.

3. The memory controller according to claim 1, wherein the second decoding process is performed after the first decoding process.

4. The memory controller according to claim 1, wherein the decoding process is a bounded distance decoding process.

5. The memory controller according to claim 1, wherein the first recurrence information is input data to the decoder.

6. The memory controller according to claim 5, wherein the input data to the decoder is a syndrome value of the first component code.

7. The memory controller according to claim 1, wherein the recurrence information is information relating to the error symbol detected by the decoding process.

8. The memory controller according to claim 1, wherein there are one or more of the error symbols detected as being present in the first component code by the first decoding process,
   there are one or more of the second component codes that protect respectively the one or more error symbols, and
   the control unit decides not to perform the counter process, when at least one of decision criteria is satisfied, of a first decision criterion such that number of the first error symbols detected for the first component code is equal to or greater than a first predetermined number, and a second decision criterion such that number of second component codes that have not succeeded in the decoding process, of the one or more second component codes that protect respectively the one or more error symbols, is equal to or greater than a second predetermined number.

9. The memory controller according to claim 1, wherein the controller decides not to perform the counter process, when number of iterations of the decoding process by the decoder is equal to or greater than a predetermined number.

10. The memory controller according to claim 1, wherein at least one of the component codes forming the multi-dimensional error correction code is either a BCH code or an RS (Reed-Solomon) code.

11. The memory controller according to claim 1, wherein the intermediate decoded word memory holds a symbol value of the respective component codes forming the multi-dimensional error correction code, as the intermediate decoded word.

12. The memory controller according to claim 1, wherein the intermediate decoded word memory holds a difference between the received word of the multi-dimensional error correction code and the intermediate decoded word, instead of the intermediate decoded word.

13. A memory system comprising:
   the memory controller according to claim 1; and
   a nonvolatile memory that stores the multi-dimensional error correction code.

14. A method of controlling a nonvolatile memory in which a multi-dimensional error correction code having two or more component codes is stored, the method comprising:
   reading out the multi-dimensional error correction code;
   acquiring a received word of the multi-dimensional error correction code;
   holding an intermediate decoded word of the multi-dimensional error correction code;
   performing a first decoding process which is decoding a first component code included in the intermediate decoded word;
   when one or more first error symbols included in the first component code are detected by the first decoding process, performing a first rewriting process which is rewriting one or more values corresponding to the one or more first error symbols in the intermediate decoded word, and recording first recurrence information for reproducing one or more values of the one or more first error symbols before rewriting;

performing a second decoding process which is decoding a second component code included in the intermediate decoded word, of which a dimension is different from that of the first component code;

determining whether the first rewriting process is an erroneous correction based on a result of the second decoding process; and when it is determined that the first rewriting process is an erroneous correction, performing a counter process which is undoing the first rewriting process based on the recorded first recurrence information.

15. The method according to claim 14, wherein the error correction code includes a plurality of first component codes and a plurality of second component codes, each of the first component codes is generated based on first data including a plurality of pieces of second data, each of the second component codes is generated based on third data including a plurality of pieces of the second data each of which is singly selected from each of the plurality of pieces of the first data included in fourth data which includes a plurality of pieces of the first data, and second data included in one third data does not overlap with second data included in another third data.

16. The method according to claim 14, wherein at least one of the first and second decoding processes includes a bounded distance decoding process.

17. The method according to claim 14, wherein the first recurrence information is a syndrome value of the first component code.

18. The method according to claim 14, wherein the first recurrence information is information relating to the detected error symbol.

19. The method according to claim 14, wherein the counter process is decided not to be performed when a number of the one or more first error symbols is equal to or greater than a first predetermined number or when a number of the second component codes each of which includes at least one of the one or more first error symbols and of which decoding processes are failed is equal to or greater than a second predetermined number.

20. The method according to claim 14, further comprising iteratively repeating executions of the first and second decoding processes, wherein the second decoding process is executed after each execution of the first decoding process, and the counter process is decided not to be performed when number of iterations of the first and second decoding processes is equal to or greater than a predetermined number.

* * * * *